US012765254B2

(12) United States Patent
Jang et al.

(10) Patent No.: US 12,765,254 B2
(45) Date of Patent: Oct. 13, 2026

(54) QUANTUM DOT COMPLEX HAVING DEFINED SURFACE-BOUND LIGAND PERCENTAGES AND DISPLAY DEVICE INCLUDING THE QUANTUM DOT COMPLEX

(71) Applicant: Samsung Display Co., Ltd., Yongin-si (KR)

(72) Inventors: Seunghee Jang, Yongin-si (KR); Jaebok Chang, Yongin-si (KR); Juo Nam, Yongin-si (KR); Kawon Pak, Yongin-si (KR); Kyungsig Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 418 days.

(21) Appl. No.: 18/448,412

(22) Filed: Aug. 11, 2023

(65) Prior Publication Data

US 2024/0172551 A1 May 23, 2024

(30) Foreign Application Priority Data

Nov. 3, 2022 (KR) ........................ 10-2022-0144872

(51) Int. Cl.
*H10K 85/10* (2023.01)
*C09K 11/02* (2006.01)
(Continued)

(52) U.S. Cl.
CPC ............ *H10K 85/151* (2023.02); *C09K 11/02* (2013.01); *C09K 11/06* (2013.01); *C09K 11/70* (2013.01);
(Continued)

(58) Field of Classification Search
CPC .. H10K 85/151; H10K 85/141; H10K 50/115; H10K 59/352; H10K 59/353;
(Continued)

(56) References Cited

U.S. PATENT DOCUMENTS 11,005,060 B2 * 5/2021 Chung .................. H10K 50/15
11,041,071 B2 * 6/2021 Tangirala ............ C08K 5/5313
(Continued)

FOREIGN PATENT DOCUMENTS

| | | |
|---|---|---|
| KR | 10-1977282 | 5/2019 |
| KR | 10-2019-0106819 | 9/2019 |
| KR | 10-2020-0041937 | 4/2020 |
| KR | 10-2367705 | 2/2022 |
| KR | 10-2022-0050830 | 4/2022 |

*Primary Examiner* — Caleb E Henry
(74) *Attorney, Agent, or Firm* — CANTOR COLBURN LLP

(57) ABSTRACT

Embodiments provide a quantum dot complex that includes a quantum dot, and ligands bonded to a surface of the quantum dot, wherein the ligands include a first ligand including a first acid functional group, a second ligand including a second acid functional group and different from the first acid functional group, and a third ligand including a thiol group, wherein a sum of the first ligand and the second ligand contained in the ligands is in a range of 40% by weight to 45% by weight, based on a total weight of the ligands, and a content of the third ligand in the ligands is in a range of 15% by weight to 20% by weight, based on the total weight of the ligands.

17 Claims, 8 Drawing Sheets

(51) Int. Cl.

| | |
|---|---|
| ***C09K 11/06*** | (2006.01) |
| ***C09K 11/70*** | (2006.01) |
| ***H10H 20/01*** | (2025.01) |
| ***H10H 20/851*** | (2025.01) |

(52) U.S. Cl.
CPC .... *H10H 20/8513* (2025.01); *H10H 20/8514* (2025.01); *H10K 85/141* (2023.02); *C09K 2211/10* (2013.01); *H10H 20/0361* (2025.01)

(58) Field of Classification Search
CPC .... H10K 59/8792; H10K 59/10; H10K 59/38; H10K 2102/331; C09K 11/02; C09K 11/06; C09K 11/70; C09K 2211/10; C09K 11/025; C09K 11/88; C09K 11/883; C09K 11/56; H10H 20/8513; H10H 20/8514; H10H 20/0361; H10H 20/8512
See application file for complete search history.

(56) References Cited

U.S. PATENT DOCUMENTS

| | | | | |
|---|---|---|---|---|
| 12,331,235 | B2 * | 6/2025 | Jung | C09K 11/025 |
| 2010/0283034 | A1 * | 11/2010 | Qu | H10K 50/115 257/14 |
| 2017/0283691 | A1 * | 10/2017 | Nick | C09K 11/02 |
| 2018/0142149 | A1 * | 5/2018 | Youn | C09K 11/70 |
| 2019/0276734 | A1 * | 9/2019 | Kim | H10K 50/15 |
| 2019/0382656 | A1 * | 12/2019 | Mocatta | C09K 11/025 |
| 2021/0074939 | A1 * | 3/2021 | Jung | H10K 59/38 |
| 2021/0126218 | A1 * | 4/2021 | Kim | H10K 50/15 |
| 2021/0129481 | A1 * | 5/2021 | Dubrow | G02F 1/133611 |
| 2021/0226172 | A1 * | 7/2021 | Chung | H10K 50/13 |
| 2021/0371738 | A1 * | 12/2021 | Lee | C09K 11/06 |
| 2021/0371739 | A1 * | 12/2021 | Lee | C09K 11/08 |
| 2021/0408416 | A1 * | 12/2021 | Angioni | H10K 50/15 |
| 2022/0119708 | A1 * | 4/2022 | Kim | C09K 11/703 |
| 2022/0243084 | A1 * | 8/2022 | Kim | C09K 11/025 |

* cited by examiner

QUANTUM DOT COMPLEX HAVING DEFINED SURFACE-BOUND LIGAND PERCENTAGES AND DISPLAY DEVICE INCLUDING THE QUANTUM DOT COMPLEX

CROSS-REFERENCE TO RELATED APPLICATION(S)

This application claims priority to and benefits of Korean Patent Application No. 10-2022-0144872 under 35 U.S.C. § 119, filed on Nov. 3, 2022, in the Korean Intellectual Property Office, the entire contents of which are incorporated herein by reference.

BACKGROUND

1. Technical Field

The disclosure relates to a quantum dot complex, a method for preparing the quantum dot complex, and a display device including the quantum dot complex.

2. Description of the Related Art

Various display devices used in multimedia devices such as televisions, mobile phones, tablet computers, navigation devices, and game consoles have been developed. Such a display device may include a display module including a so-called self-luminous light-emitting element including a light-emitting material to emit light to display an image.

In order to improve color reproducibility of the display device, the display device may include different types of light control layers depending on a pixel. The light control layer may transmit therethrough only a portion of a wavelength range of light from a light source or convert the wavelength range of the light from the light source. Development of a light-emitting element using quantum dots as a light-emitting material is in progress. In this regard, there is a demand to improve light-emitting efficiency and high color characteristics of the light-emitting element using the quantum dots.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a quantum dot complex exhibiting high quantum yield and excellent stability.

Embodiments provide a method for preparing a quantum dot complex exhibiting high quantum yield and excellent stability.

Embodiments provide a display device including a quantum dot complex and thus having improved light-emitting efficiency.

An embodiment provides a quantum dot complex which may include a quantum dot, and ligands binding to a surface of the quantum dot; wherein the ligands may include a first ligand including a first acid functional group, a second ligand including a second acid functional group different from the first acid functional group, and a third ligand including a thiol group; a sum of the first ligand and the second ligand contained in the ligands may be in a range of 40% by weight to 45% by weight, based on a total weight of the ligands; and a content of the third ligand in the ligands may be in a range of 15% by weight to 20% by weight, based on the total weight of the ligands.

In an embodiment, the ligands may further include a basic ligand including a non-polar functional group.

In an embodiment, each of the first acid functional group, the second acid functional group, and the thiol group may bind to the surface of the quantum dot.

In an embodiment, the first ligand may include a first main body linked to the first acid functional group; the second ligand may include a second main body linked to the second acid functional group; and the first main body and the second main body may be different from each other.

In an embodiment, the third ligand may include a third main body linked to the thiol group.

In an embodiment, the first ligand may be represented by Chemical Formula 1:

[Chemical Formula 1]

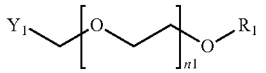

In Chemical Formula 1, $Y_1$ may be the first acid functional group, $R_1$ may be a substituted or unsubstituted alkyl group having 1 to 20 carbon atoms, and n1 may be an integer from 1 to 10.

In an embodiment, the second ligand may be represented by Chemical Formula 2:

[Chemical Formula 2]

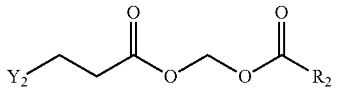

In Chemical Formula 2, $Y_2$ may be the second acid functional group, and $R_2$ may be a substituted or unsubstituted alkyl group having 1 to 20 carbon atoms or a substituted or unsubstituted alkenyl group having 2 to 20 carbon atoms.

In an embodiment, the third ligand may be represented by Chemical Formula 3:

[Chemical Formula 3]

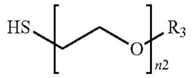

In Chemical Formula 3, $R_3$ may be a substituted or unsubstituted alkyl group having 1 to 20 carbon atoms, and n2 may be an integer from 1 to 10.

In an embodiment, the quantum dot may include a core, and a shell surrounding the core; and each of the ligands may bind to a surface of the shell.

In an embodiment, the core may include a first semiconductor nanocrystal; the shell may include a second semiconductor nanocrystal different from the first semiconductor nanocrystal; and the first semiconductor nanocrystal and the second semiconductor nanocrystal may each independently be a Group II-VI compound, a Group III-VI compound, a Group I-III-VI compound, a Group III-V compound, a Group III-II-V compound, a Group IV-VI compound, a Group IV element, a Group IV compound, or a combination thereof.

In an embodiment, the core may include InP or AgInGaS.

In an embodiment, a molecular weight of each of the ligands may be in a range of 200 to 400.

In an embodiment, a content of the first ligand in the ligands may be in a range of 10% by weight to 15% by weight, based on the total weight of the ligands; and a content of the second ligand in the ligands may be in a range of 25% by weight to 35% by weight, based on the total weight of the ligands.

In an embodiment, the quantum dot complex may have a light maintaining percentage in a range of 90% to 105%; and the light maintaining percentage may be expressed based on Equation 1:

$$\text{light maintaining percentage}\,(\%) = X_1/X_0 * 100 \qquad \text{[Equation 1]}$$

In Equation 1, $X_1$ may be a quantum yield measured after irradiating the quantum dot complex with 460 nm excitation light at an intensity of 60 $mW/cm^2$ for 500 hours, and $X_0$ may be a quantum yield measured before irradiating the quantum dot complex with the excitation light.

Embodiments provide a method for preparing a quantum dot complex which may include providing a pre-quantum dot complex including a quantum dot and a basic ligand bound to a surface of the quantum dot, and exchanging at least a portion of the basic ligand bound to the pre-quantum dot complex with polar ligands to form a quantum dot complex; wherein the polar ligands may include a first ligand including a first acid functional group, a second ligand including a second acid functional group different from the first acid functional group, and a third ligand including a thiol group; a sum of the first ligand and the second ligand contained in the polar ligands may be in a range of 40% by weight to 45% by weight, based on a total weight of the basic ligand contained in the pre-quantum dot complex; and a content of the third ligand in the polar ligands may be in a range of 15% by weight to 20% by weight, based on the total weight of the basic ligand contained in the pre-quantum dot complex.

In an embodiment, the exchanging at least a portion of the basic ligand bound to the pre-quantum dot complex with the polar ligands to form the quantum dot complex may include heating a first mixture including the pre-quantum dot complex, the first solvent, and the polar ligands at a first temperature.

In an embodiment, the first ligand may be represented by Chemical Formula 1, the second ligand may be represented by Chemical Formula 2, and the third ligand may be represented by Chemical Formula 3:

[Chemical Formula 1]

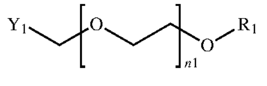

[Chemical Formula 2]

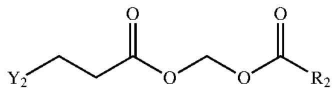

-continued

[Chemical Formula 3]

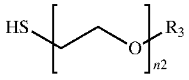

In Chemical Formula 1, Chemical Formula 2, and Chemical Formula 3, $Y_1$ may be the first acid functional group, $Y_2$ may be the second acid functional group, $R_1$ and $R_3$ may each independently be a substituted or unsubstituted alkyl group having 1 to 20 carbon atoms, $R_2$ may be a substituted or unsubstituted alkyl group having 1 to 20 carbon atoms or a substituted or unsubstituted alkenyl group having 2 to 20 carbon atoms, and n1 and n2 may each independently be an integer from 1 to 10.

Embodiments provide a display device which may include a display panel, and a light control layer disposed on the display panel, the light control layer including light control areas; wherein at least one of the light control areas may include a quantum dot complex; the quantum dot complex may include a quantum dot, and ligands binding to a surface of the quantum dot; the ligands may include a first ligand including a first acid functional group, a second ligand including a second acid functional group different from the first acid functional group, and a third ligand including a thiol group; a sum of the first ligand and the second ligand contained in the ligands may be in a range of 40% by weight to 45% by weight, based on a total weight of the ligands; and a content of the third ligand in the ligands may be in a range of 15% by weight to 20% by weight, based on the total weight of the ligands.

In an embodiment, the display panel may include a light-emitting element emitting a first light; and the light control layer may include a first light control area transmitting the first light therethrough, a second light control area converting the first light into a second light, and a third light control area converting the first light into a third light.

In an embodiment, the display device may further include a color filter layer disposed on the light control layer, wherein the color filter layer may include a first filter, a second filter, and a third filter respectively corresponding to the first light control area, the second light control area, and the third light control area.

It is to be understood that the embodiments above are described in a generic and explanatory sense only and not for the purpose of limitation, and the disclosure is not limited to the embodiments described above.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
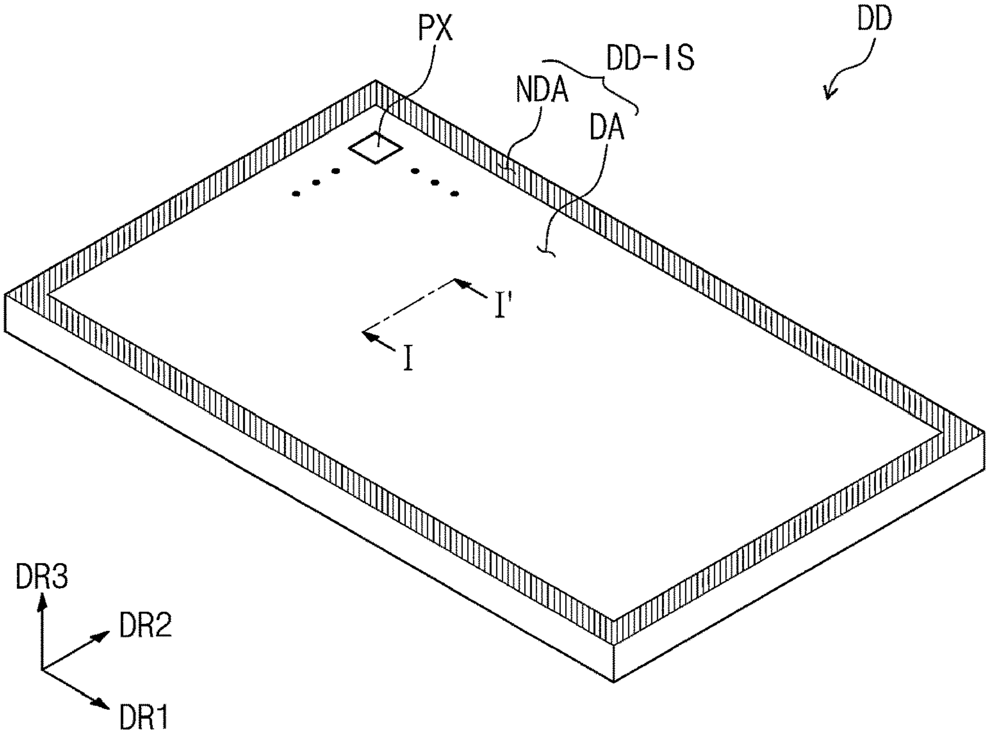
FIG. 1 is a schematic perspective view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity Like reference numbers and reference characters refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group consisting of" for the purpose of its meaning and interpretation. For example, "at least one of A, B, and C" may be understood to mean A only, B only, C only, or any combination of two or more of A, B, and C, such as ABC, ACC, BC, or CC. When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

As used herein, "Group" refers to a Group of the IUPAC periodic table.

As used herein, "Group II" may include a Group IIA element and a Group IIB element. For example, the Group II element may be magnesium (Mg) or zinc (Zn). However, the disclosure is not limited thereto.

As used herein, "Group III" may include a Group IIIA element and a Group IIIB element. For example, the Group III element may be aluminum (Al), indium (In), gallium (Ga), or titanium (Ti). However, the disclosure is not limited thereto.

As used herein, "Group V" may include a Group VA element and a Group VB element. For example, a Group V element may be phosphorus (P), arsenic (As), or antimony (Sb). However, the disclosure is not limited thereto.

As used herein, "Group VI" may include a Group VIA element and a Group VIB element. For example, a Group VI may be oxygen (O), sulfur (S), selenium (Se) or tellurium (Te). However, the disclosure is not limited thereto.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a quantum dot complex according to an embodiment of the disclosure and a display device including the quantum dot complex will be described with reference to the drawings.

FIG. 1 is a schematic perspective view of a display device DD according to an embodiment.

Referring to FIG. 1, the display device DD of an embodiment may be a device activated according to an electrical signal. For example, the display device DD may be a large device such as a television, a monitor, or an outdoor billboard. The display device DD may be a small or medium-sized device such as a personal computer, a notebook computer, a personal digital terminal, a car navigation unit, a game console, a smartphone, a tablet, and a camera. However, embodiments are not limited thereto, and the display device may be embodied as other electronic devices.

The display device DD may display an image (or video) on a display face DD-IS. The display face DD-IS may be parallel to a plane defined by a first direction DR1 and a second direction DR2. The display face DD-IS may include a display area DA and a non-display area NDA.

A pixel PX may be disposed in the display area DA, and the pixel PX may not be disposed in the non-display area NDA. The non-display area NDA may be defined along an edge of the display face DD-IS. The non-display area NDA may surround the display area DA. However, embodiments are not limited thereto, and the non-display area NDA may be omitted or the non-display area NDA may be disposed on only one side of the display area DA.

FIG. 1 shows the display device DD having a flat display face DD-IS. However, embodiments are not limited thereto, and the display device DD may include a curved display face or a stereoscopic display face. The stereoscopic display face may include multiple display areas facing in different directions.

A thickness direction of the display device DD may be a direction parallel to a third direction DR3, which is a normal direction to the plane defined by the first direction DR1 and the second direction DR2. As used herein, each of directions indicated by the first to third directions DR1, DR2, and DR3 may be construed as a relative concept and may be converted to other directions.

As used herein, a top face (or a front face) and a bottom face (or a back face) of each of members constituting the display device DD may be defined in the third direction DR3. For example, a face relatively closer to the display face DD-IS among two faces facing each other in the third direction DR3 of one member may be defined as the front face (or the top face), and a face relatively away from the display face DD-IS among the two faces facing each other in the third direction DR3 of one member may be defined as the back face (or the bottom face). In the specification, a top direction and a bottom direction may each be defined in the third direction DR3. A direction toward the top may be defined as a direction toward the display face DD-IS while a direction toward the bottom may be defined as a direction away from the display face DD-IS.

Figure 2:
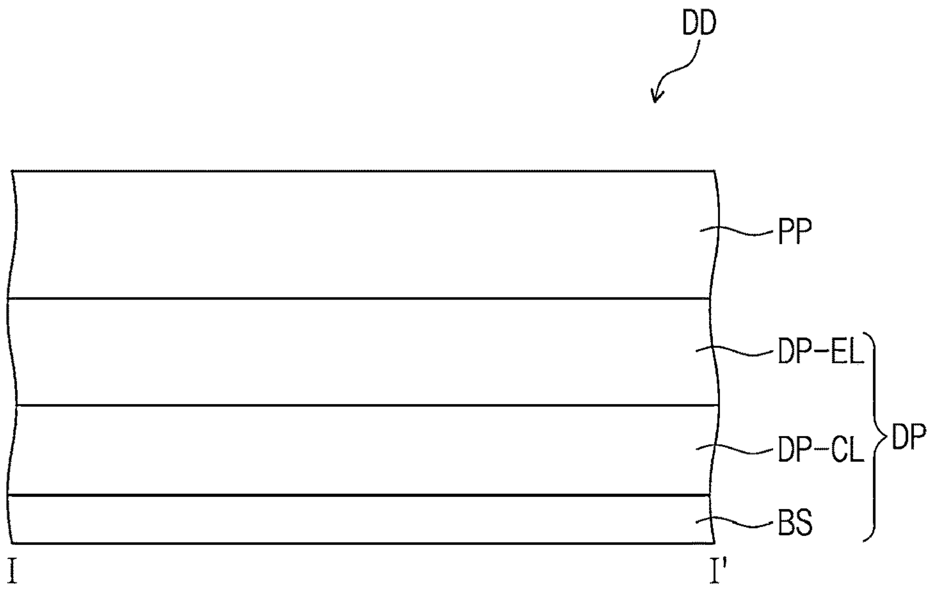
FIG. 2 is a schematic cross-sectional view of a display device according to an embodiment.

FIG. 2 is a schematic cross-sectional view of the display device DD according to an embodiment. FIG. 2 is a cross-sectional view of the display device DD according to an embodiment corresponding to a line I-I' of FIG. 1.

Referring to FIG. 2, the display device DD may include a display panel DP and an optical structure layer PP disposed on the display panel DP. The display panel DP may include a display element layer DP-EL. The display element layer DP-EL includes a light-emitting element ED (see FIG. 4A).

The optical structure layer PP may be disposed on the display panel DP and may control light that is reflected at the display panel DP from an external light. The optical structure layer PP may include, for example, a polarization layer or a color filter layer.

In the display device DD according to an embodiment, the display panel DP may be a light-emitting display panel. For example, the display panel DP may be a quantum dot light-emitting display panel including a quantum dot light-emitting element. However, embodiments are not limited thereto.

The display panel DP may include a base substrate BS, a circuit layer DP-CL disposed on the base substrate BS, and the display element layer DP-EL disposed on the circuit layer DP-CL.

The base substrate BS may provide a base surface on which the display element layer DP-EL is disposed. The base substrate BS may be a glass substrate, a metal substrate, a plastic substrate, or the like. However, embodiments are not limited thereto, and the base substrate BS may include an inorganic layer, an organic layer, or a composite material layer. The base substrate BS may be a flexible substrate that can be readily bent or folded.

In an embodiment, the circuit layer DP-CL may be disposed on the base substrate BS, and the circuit layer DP-CL may include transistors (not shown). Each of the transistors (not shown) may include a control electrode, an input electrode, and an output electrode. For example, the circuit layer DP-CL may include a switching transistor and a driving transistor for driving the light-emitting element ED of the display element layer DP-EL.

Figure 3:
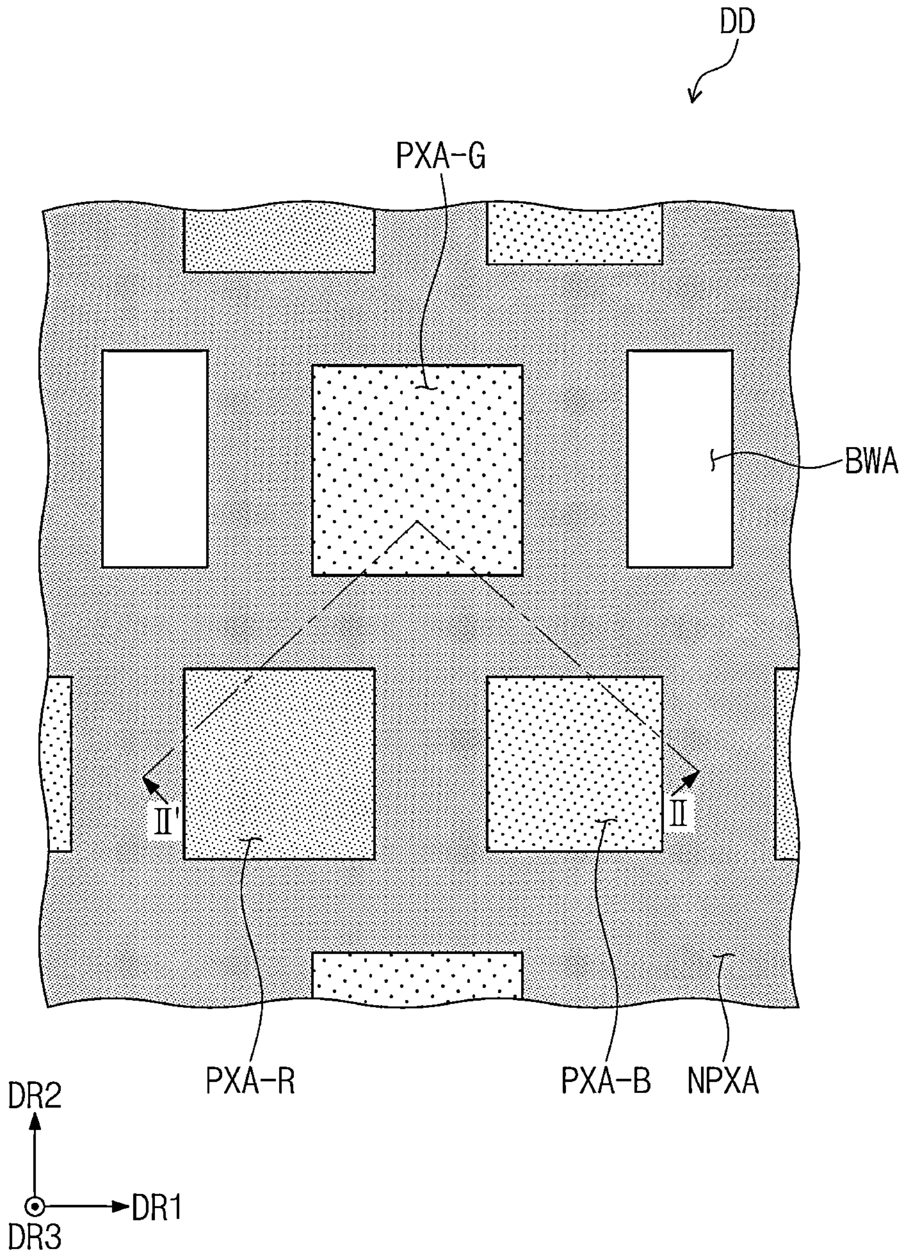
FIG. 3 is a schematic plan view of a portion of a display device according to an embodiment.

FIG. 3 is a schematic plan view of a portion of the display device DD according to an embodiment. Referring to FIG. 3, the display device DD according to an embodiment may include a plane including three light-emitting areas PXA-R, PXA-B, and PXA-G and bank well areas BWA adjacent thereto. In an embodiment, the three light-emitting areas PXA-R, PXA-B, and PXA-G as shown in FIG. 3 may be repeatedly arranged throughout the display area DA (see FIG. 1).

A peripheral area NPXA may be disposed around each of the first to third light-emitting areas PXA-R, PXA-B, and PXA-G. The peripheral area NPXA may define a boundary of each of the first to third light-emitting areas PXA-R, PXA-B, and PXA-G. The peripheral area NPXA may surround each of the first to third light-emitting areas PXA-R, PXA-B, and PXA-G. A structure that prevents color mixing between the first to third light-emitting areas PXA-R, PXA-B, and PXA-G, for example a pixel defining film PDL (see FIG. 4A), may be disposed in the peripheral area NPXA.

In FIG. 3, the first to third light-emitting areas PXA-R, PXA-B, and PXA-G having the same planar shape and different planar area sizes are shown by way example, but embodiments are not limited thereto. Area sizes of at least two or more of the first to third light-emitting areas PXA-R, PXA-B, and PXA-G may be equal to each other. An area size of each of the first to third light-emitting areas PXA-R, PXA-B, and PXA-G may be determined based on a color of light emitted therefrom. A light-emitting area emitting green light may have the largest area size, while a light-emitting area emitting blue light may have the smallest area size. The area sizes of the first to third light-emitting areas PXA-R, PXA-B, and PXA-G may be variously changed.

FIG. 3 illustrates that a planar shape of each of the first to third light-emitting areas PXA-R, PXA-B, and PXA-G is rectangular. However, embodiments are not limited thereto. In a plan view, each of the first to third light-emitting areas PXA-R, PXA-B, and PXA-G may have a polygonal shape (for example, a substantial polygonal shape) other than the rectangular shape such as a rhombus or a pentagon. In an embodiment, each of the first to third light-emitting areas PXA-R, PXA-B, and PXA-G may have a rectangular shape (for example, a substantially rectangular shape) with rounded corners in a plan view.

FIG. 3 illustrates that the third light-emitting area PXA-G is disposed in a first row, and the first light-emitting area PXA-R and the second light-emitting area PXA-B are disposed in a second row. However, embodiments are not limited thereto. The arrangement of the first to third light-emitting areas PXA-R, PXA-B, and PXA-G may be variously changed. For example, the first to third light-emitting areas PXA-R, PXA-B, and PXA-G may be arranged in a same row.

The bank well area BWA may be defined in the display area (DA in FIG. 1). The bank well area BWA may be an area where a bank well (not shown) is formed to prevent defects caused by erroneous deposition in a process of patterning the light control areas CCP-R, CCP-B, and CCP-G (see FIG. 4A) included in the light control layer CCL (see FIG. 4A). For example, the bank well area BWA may be an area in which the bank well formed by removing a portion of a partition walls BK (see FIG. 4A) is defined.

FIG. 3 shows that two bank well areas BWA may be defined so as to be adjacent to the third light-emitting area PXA-G, but embodiments are not limited thereto. A shape of the bank well area BWA and an arrangement thereof may be variously changed.

Figure 4A:
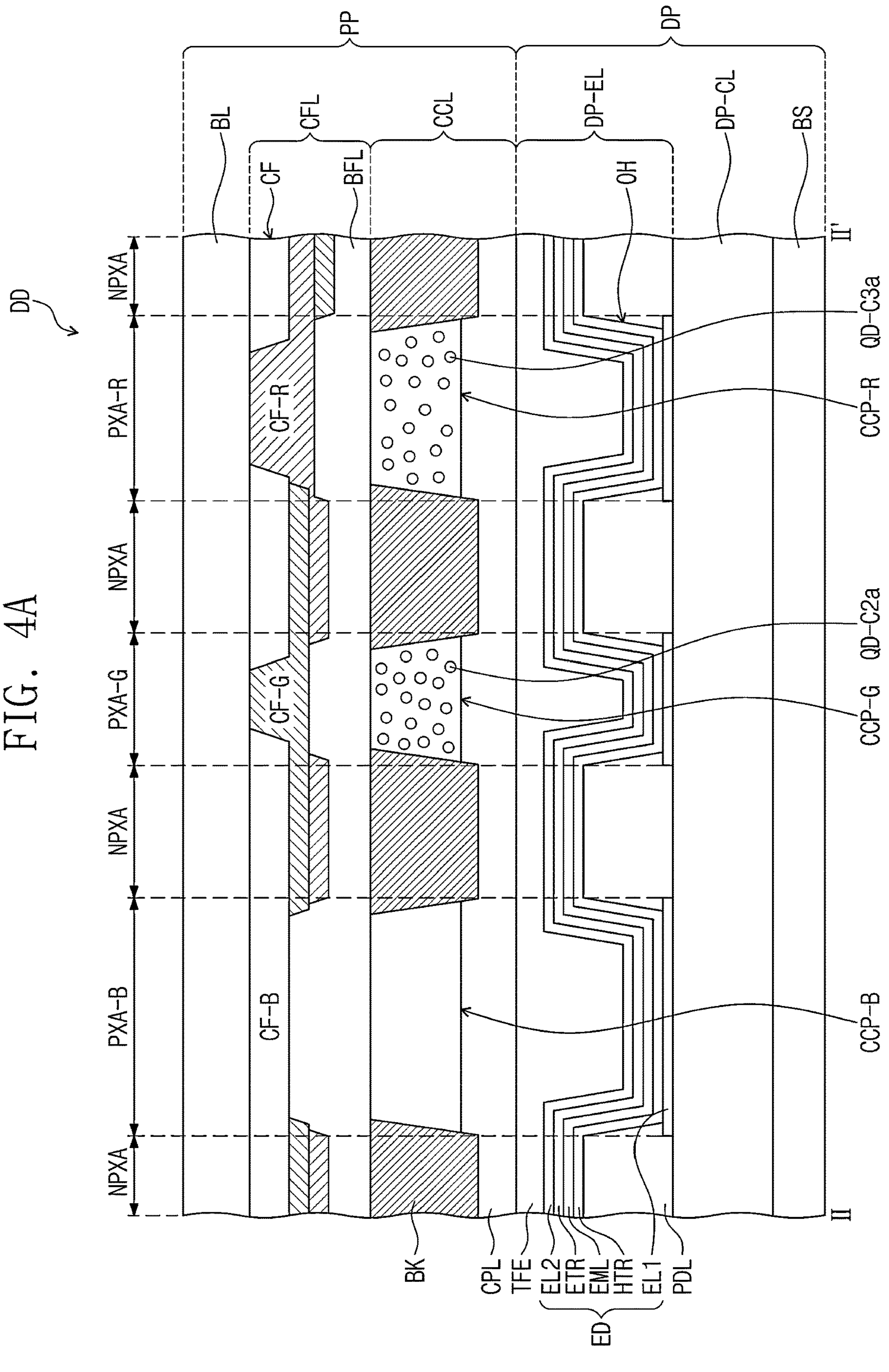
FIG. 4A and FIG. 4B are schematic cross-sectional views of a display device according to an embodiment.
Figure 4B:
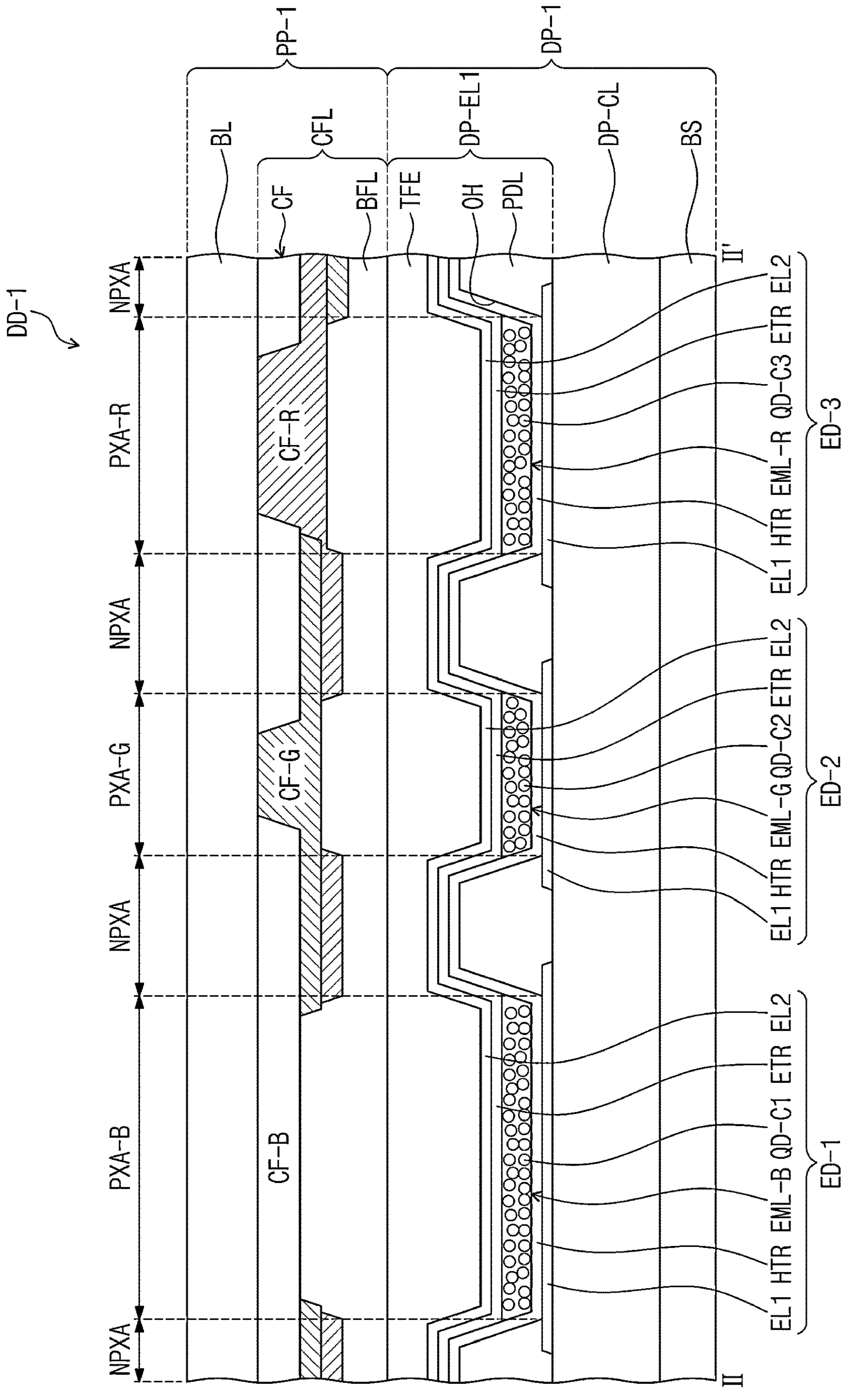

FIG. 4A and FIG. 4B are respectively schematic cross-sectional views of display devices DD and DD-1 according to an embodiment. Each of FIG. 4A and FIG. 4B shows a schematic cross section corresponding to line II-II' as shown in FIG. 3.

In each of the display devices DD and DD-1 of an embodiment as shown in FIG. 3, FIG. 4A, and FIG. 4B, the three light-emitting areas PXA-B, PXA-G, and PXA-R respectively emitting blue light, green light, and red light are shown by way of example. For example, each of the display devices DD and DD-1 of an embodiment may include the blue light-emitting area PXA-B, the green light-emitting area PXA-G, and the red light-emitting area PXA-R, which are distinguished from each other.

Referring to FIG. 4A and FIG. 4B, the display devices DD and DD-1 according to an embodiment may respectively include display panels DP and DP-1 including each of light-emitting elements ED, and ED-1, ED-2, and ED-3, and optical structure layers PP and PP-1 disposed on each of the display panels DP and DP-1.

The display panels DP and DP-1 may respectively include a base substrate BS, a circuit layer DP-CL, and a display element layer DP-EL and DP-EL1 disposed on the base substrate BS. The display element layers DP-EL and DP-EL1 may each include a pixel defining film PDL, light-emitting elements ED, and ED-1, ED-2, and ED-3 disposed between portions of the pixel defining film PDL or disposed on the pixel defining film PDL, and an encapsulation layer TFE respectively disposed on the light-emitting elements ED, and ED-1, ED-2, and ED-3.

The display element layers DP-EL and DP-EL1 may respectively include the pixel defining film PDL. Each of the light-emitting areas PXA-R, PXA-G, and PXA-B may be separated by the pixel defining film PDL. The peripheral area NPXA may be provided between adjacent light-emitting areas PXA-B, PXA-G, and PXA-R, and may correspond to the pixel defining film PDL. In the specification, the light-emitting areas PXA-B, PXA-G, and PXA-R may each correspond to a pixel. As shown in FIG. 4A, an organic layer such as a light-emitting layer EML included in the light-emitting element ED may be provided as a common layer overlapping all of the light-emitting areas PXA-R, PXA-G, and PXA-B and the peripheral area NPXA. In another embodiment, as shown in FIG. 4B, the pixel defining film PDL may separate the light-emitting elements ED-1, ED-2, and ED-3 from each other. As shown in FIG. 4B, light-emitting layers EML-B, EML-G, and EML-R of the light-emitting elements ED-1, ED-2, and ED-3 may be respectively disposed in openings OH defined by the pixel defining film PDL, and may be distinguished from each other.

The pixel defining film PDL may be made of a polymer resin. For example, the pixel defining film PDL may include a polyacrylate-based resin or a polyimide-based resin. The pixel defining film PDL may further include an inorganic material, in addition to the polymer resin. The pixel defining film PDL may include a light absorbing material, or may include a black pigment or black dye. The pixel defining film PDL including the black pigment or black dye may form a black pixel defining film. Carbon black or the like may be used as the black pigment or black dye when forming the pixel defining firm PDL, but embodiments are not limited thereto.

The pixel defining film PDL may be made of an inorganic material. For example, the pixel defining film PDL may include silicon nitride ($SiN_x$), silicon oxide ($SiO_x$), silicon oxynitride ($SiO_xN_y$), or the like. The pixel defining film PDL may define the light-emitting areas PXA-B, PXA-G, and PXA-R. The light-emitting areas PXA-B, PXA-G, and PXA-R and the peripheral area NPXA may be separated by the pixel defining film PDL.

Referring to FIG. 4A, the display element layer DP-EL may include the light-emitting element ED which is partially disposed on the pixel defining film PDL. The display device DD of an embodiment may include the light-emitting element ED, wherein the light-emitting element ED may include the light-emitting layer EML. The light-emitting element ED according to an embodiment includes a first electrode EL1, a second electrode EL2 facing the first electrode EL1, and functional layers including the light-emitting layer EML disposed between the first electrode EL1 and the second electrode EL2.

The functional layers may include a hole transport area HTR disposed between the first electrode EL1 and the light-emitting layer EML, and an electron transport area ETR disposed between the light-emitting layer EML and the second electrode EL2. Although not shown in the drawings, in an embodiment, an element capping layer may be further disposed on the second electrode EL2.

The hole transport region HTR and the electron transport region ETR may include sub-functional layers. For example, the hole transport region HTR may include a hole injection layer and a hole transport layer as sub-functional layers. The electron transport region ETR may include an electron injection layer and an electron transport layer as sub-functional layers. However, embodiments are not limited thereto, and the hole transport region HTR may further include an electron blocking layer, etc. as a sub-functional layer, and the electron transport region ETR may include a hole blocking layer, etc. as a sub-functional layer.

The first electrode EL1 may have conductivity. The first electrode EL1 may be made of a metal alloy or a conductive compound. The first electrode EL1 may be an anode. The first electrode EL1 may be a pixel electrode. The first electrode EL1 may be a reflective electrode. However, an embodiments are not limited thereto, and the first electrode EL1 may be a transmissive electrode or a transflective electrode. When the first electrode EL1 is a transflective electrode or a reflective electrode, the first electrode EL1 may include Ag, Mg, Cu, Al, Pt, Pd, Au, Ni, Nd, Jr, Cr, Li, Ca, LiF/Ca, LiF/Al, Mo, Ti, Yb, W, a compound thereof, or a mixture thereof (e.g., a mixture of Ag and Mg). In another embodiment, the first electrode EL1 may include a layer including a reflective film or a transflective film made of the materials described above and a transparent conductive film made of ITO (indium tin oxide), IZO (indium zinc oxide), ZnO (zinc oxide), ITZO (indium tin zinc oxide), etc. For example, the first electrode EL1 may have a stack of multiple metal films or may have a structure in which ITO/Ag/ITO films are stacked.

The hole transport region HTR may be disposed on the first electrode ELL The hole transport region HTR may include a hole injection layer (not shown) and a hole transport layer (not shown). The hole transport region HTR may be a single layer consisting of a single material, a single layer including different materials, or a structure including multiple layers including different materials.

The hole transport region HTR may be formed using a variety of methods including a vacuum deposition method, a spin coating method, a cast method, a Langmuir-Blodgett (LB) method, an inkjet printing method, a laser printing method, a laser induced thermal imaging (LITI) method, and the like.

The hole transport region HTR may include, for example, carbazole-based derivatives such as N-phenylcarbazole, polyvinylcarbazole, etc., fluorene-based derivatives, triphenylamine-based derivatives such as N,N'-bis(3-methylphenyl)-N,N'-diphenyl-[1,1-biphenyl]-4,4'-diamine (TPD), 4,4',4"-tris(N-carbazolyl)triphenylamine (TCTA), etc., N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-Bis[N,N'-(3-tolyl)amino]-3,3'-dimethylbiphenyl (HMTPD), 1,3-bis(N-carbazolyl)benzene (mCP), etc.

The hole transport region HTR may have a thickness in a range of about 5 nm to about 1,500 nm. For example, the hole transport region HTR may have a thickness in a range of about 10 nm to about 500 nm. When the thickness of the hole transport region HTR satisfies any of the aforementioned ranges, satisfactory hole transport characteristics may be obtained without substantial rise in a driving voltage.

The light-emitting layer EML may be disposed on the hole transport region HTR. The light-emitting layer EML may include a host and a dopant. In an embodiment, the light-emitting layer EML may include an organic light-emitting material as a dopant material. In another embodiment, the light-emitting layer EML may include a quantum dot complex QD-C (see FIG. 5A) which will be described later as a dopant material. In an embodiment, the light-emitting layer EML may further include an organic host material in addition to the dopant material. The light-emitting layer EML included in the light-emitting element ED in the display panel DP according to an embodiment may emit blue light having a central wavelength in a range of about 420 nm to about 480 nm.

In the light-emitting element ED according to an embodiment, the electron transport region ETR may be disposed on the light-emitting layer EML. The electron transport region ETR may include at least one of an electron transport layer (not shown) and an electron injection layer (not shown). However, embodiments are not limited thereto.

The electron transport region ETR may be a layer consisting of a single material, a layer including different materials, or a structure including multiple layers including multiple different materials. For example, the electron transport region ETR may have a structure consisting of an electron injection layer or an electron transport layer, or may have a structure including an electron injection material and an electron transport material. A thickness of the electron transport region ETR may have a thickness in a range of, for example, about 20 nm to about 150 nm.

The electron transport region ETR may be formed using a variety of schemes including a vacuum deposition method, a spin coating method, a cast method, a Langmuir-Blodgett (LB) method, an inkjet printing method, a laser printing method, a laser induced thermal imaging (LITI) method, or the like.

The electron transport region ETR may include, for example, an anthracene-based compound, Tris(8-hydroxyquinolinato)aluminum ($Alq_3$), 1,3,5-tri [(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), or mixtures thereof. In another embodiment, the electron transport region ETR may include a metal halide such as LiF, NaCl, CsF, RbCl, or RbI, a lanthanide metal such as Yb, a metal oxide such as $Li_2O$ or BaO, or lithium quinolate (LiQ), etc.

The second electrode EL2 may be disposed on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be made of a transparent metal oxide, for example, indium tin oxide (ITO), indium zinc oxide (IZO), zinc oxide (ZnO), indium tin zinc oxide (ITZO), and the like. When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof. In another embodiment, the second electrode EL2 may have a multilayer structure including a reflective film or transflective film formed of the materials described above, and a transparent conductive film made of indium tin oxide (ITO), indium zinc oxide (IZO), zinc oxide (ZnO), indium tin zinc oxide (ITZO), and the like.

Although not shown, the second electrode EL2 may be electrically connected to an auxiliary electrode. When the second electrode EL2 is electrically connected to the auxiliary electrode, resistance of the second electrode EL2 may be reduced.

Referring to FIG. 3 and FIG. 4A, in the display device DD according to an embodiment, the areas of the light-emitting areas PXA-B, PXA-G, and PXA-R may be different from each other. For example, the light-emitting areas PXA-B, PXA-G, and PXA-R may have different areas according to the colors of light emitted therefrom. Each of the areas may be an area in a plan view defined by the first direction DR1 and the second direction DR2. For example, in the display device DD according to an embodiment, the blue light-emitting area PXA-B emitting blue light may have the smallest area in a plan view, and the green light-emitting area PXA-G emitting green light may have the largest area in a plan view. However, embodiments are not limited thereto. The light-emitting areas PXA-B, PXA-G, and PXA-R may emit light of colors other than blue light, green light, and red light. In another embodiment, the light-emitting areas PXA-B, PXA-G, and PXA-R may have the same area. In another embodiment, the light-emitting areas PXA-B, PXA-G, and PXA-R may have areas which are different from that as shown in FIG. 3. In an embodiment, each of the light-emitting areas PXA-R, PXA-B, and PXA-G may have various polygonal shapes or a circular shape different from those as shown in FIG. 3. An arrangement structure of the light-emitting areas is not limited to what is illustrated. For example, in an embodiment, the light-emitting areas PXA-B, PXA-G, and PXA-R may be arranged in a pentile configuration (for example, a Pentile™ configuration) or in a diamond configuration (for example, a Diamond Pixel™ configuration).

Referring to FIG. 4B, in the display panel DP-1 of the display device DD-1, the display element layer DP-EL1 may include the light-emitting elements ED-1, ED-2, and ED-3. The light-emitting elements ED-1, ED-2, and ED-3 may emit light of different wavelengths. For example, in an embodiment, the display element layer DP-EL1 may include the first light-emitting element ED-1 emitting blue light, the second light-emitting element ED-2 emitting green light, and the third light-emitting element ED-3 emitting red light. The blue light-emitting area PXA-B, the green light-emitting area PXA-G, and the red light-emitting area PXA-R of the display device DD-1 may respectively correspond to the first light-emitting element ED-1, the second light-emitting element ED-2, and the third light-emitting element ED-3. However, an embodiment is not limited thereto. The first to third light-emitting elements ED-1, ED-2, and ED-3 may emit light in the same wavelength region or at least one of the first to third light-emitting elements ED-1, ED-2, and ED-3 may emit light in a different wavelength region from those of the remaining ones thereof.

For example, the blue light-emitting area PXA-B, the green light-emitting area PXA-G, and the red light-emitting area PXA-R of the display device DD-1 may respectively correspond to the first light-emitting element ED-1, the second light-emitting element ED-2, and the third light-emitting element ED-3.

The display device DD-1 according to an embodiment may include the light-emitting elements ED-1, ED-2, and ED-3. According to an embodiment, at least one of the light-emitting elements ED-1, ED-2, and ED-3 may include a light-emitting layer EML-B, EML-G, and/or EML-R including a quantum dot complex QD-C1, QD-C2, and/or QD-C3.

The light-emitting layers EML-B, EML-G, and EML-R may respectively include the quantum dot complexes QD-C1, QD-C2, and QD-C3. In an embodiment, each of the light-emitting layers EML-B, EML-G, and EML-R may emit light based on fluorescence. For example, each of the quantum dot complexes QD-C1, QD-C2, and QD-C3 may be used as a fluorescent dopant material.

Each of the quantum dot complexes QD-C1, QD-C2, and QD-C3 included in each of the light-emitting layers EML-B, EML-G, and EML-R may include quantum dot complexes stacked to form a layer. In FIG. 4B, each of the quantum dot complexes QD-C1, QD-C2, and QD-C3 has a circular cross-sectional shape and includes quantum dot complexes vertically arranged to form two layers. However, embodiments are not limited thereto. For example, an arrangement of the quantum dot complexes QD-C1, QD-C2, and QD-C3 may vary based on a thickness of each of the light-emitting layers EML-B, EML-G, and EML-R, a shape of each of the quantum dot complexes QD-C1, QD-C2, and QD-C3 respectively included in the light-emitting layers EML-B, EML-G, and EML-R, and an average diameter of each of the quantum dot complexes QD-C1, QD-C2, and QD-C3. For example, in each of the light-emitting layers EML-B, EML-G, and EML-R, the quantum dot complexes QD-C1, QD-C2, and QD-C3 may be horizontally arranged to be adjacent to each other to form one layer, or may be vertically and horizontally arranged to form multiple layers such as two or three layers.

The first light-emitting layer EML-B of the first light-emitting element ED-1 may include the first quantum dot complex QD-C1. The first quantum dot complex QD-C1 may emit blue light. The second light-emitting layer EML-G of the second light-emitting element ED-2 may include the second quantum dot complex QD-C2. The second quantum dot complex QD-C2 may emit green light. The third light-emitting layer EML-R of the third light-emitting element ED-3 may include the third quantum dot complex QD-C3. The third quantum dot complex QD-C3 may emit red light.

Each of the quantum dot complexes QD-C1, QD-C2, and QD-C3 may include a core and a shell surrounding the core. Accordingly, each of the quantum dot complexes QD-C1, QD-C2, and QD-C3 may have a core/shell structure. In an embodiment, the first to third quantum dot complexes QD-C1, QD-C2, and QD-C3 respectively included in the light-emitting elements ED-1, ED-2, and ED-3 may include different core materials. In another embodiment, the first to third quantum dot complexes QD-C1, QD-C2, and QD-C3 may include a same core material. In another embodiment, two of the first to third quantum dot complexes QD-C1, QD-C2, and QD-C3 may include a same core material and the other quantum dot complex may include a different core material.

In an embodiment, the first to third quantum dot complexes QD-C1, QD-C2, and QD-C3 may have different diameters. For example, the first quantum dot complex QD-C1 used in the first light-emitting element ED-1 that emits light in a relatively shorter wavelength region may have a smaller average diameter than that of each of the second quantum dot complex QD-C2 of the second light-emitting element ED-2 and the third quantum dot complex QD-C3 of the third light-emitting element ED-3 each emitting light in a longer wavelength region. In the specification, an average diameter refers to an arithmetic average of the diameters of the quantum dots. In an embodiment, the diameter of the quantum dot particle may be an average value of a width of the quantum dots in a cross-sectional view.

The relationship between the average diameters of the first to third quantum dot complexes QD-C1, QD-C2, and QD-C3 is not limited to the above embodiment. For example, in FIG. 4B, it is illustrated that the sizes of the first to third quantum dot complexes QD-C1, QD-C2, and QD-C3 may be similar. However, the first to third quantum dot complexes QD-C1, QD-C2, and QD-C3 respectively included in the light-emitting elements ED-1, ED-2, and ED-3 may have different sizes.

In an embodiment, a structure, a material, and physical or chemical properties of each of the quantum dot complexes QD-C1, QD-C2, and QD-C3 are described in more detail with reference to FIG. 5A.

In FIG. 4B, it is illustrated that the light-emitting layers EML-B, EML-G, and EML-R have similar thicknesses. However, embodiments are not limited thereto. For example, in an embodiment, the light-emitting layers EML-B, EML-G, and EML-R of the first to third light-emitting elements ED-1, ED-2, and ED-3 may have different thicknesses.

Referring to FIG. 4A and FIG. 4B, the encapsulation layer TFE may be disposed on the light-emitting elements ED and ED-1, ED-2, and ED-3 so as to cover the light-emitting elements ED and ED-1, ED-2, and ED-3. The encapsulation layer TFE may be a single layer or a stack of layers. The encapsulation layer TFE may be a thin-film encapsulation layer. The encapsulation layer TFE protects the light-emitting elements ED, ED-1, ED-2, and ED-3. The encapsulation layer TFE may cover a top face of the second electrode EL2 disposed on the opening OH and may fill the opening OH.

Referring to FIG. 4A and FIG. 4B, the display devices DD and DD-1 may respectively include optical structure layers PP and PP-1. Each of the optical structure layers PP and PP-1 may block external light provided from an outside out of each of the display devices DD and DD-1 from being incident into each of the display panels DP and DP-1. The optical structure layers PP and PP-1 may block a portion of the external light. Each of the optical structure layers PP and PP-1 may have an antireflection function that minimizes reflection of the external light.

Referring to FIG. 4A, the display device DD according to an embodiment may include a light control layer CCL disposed on the display panel DP.

The light control layer CCL may include a light conversion particle. The light conversion particle may be a quantum dot or a phosphor. The light conversion particle may convert a wavelength of the light incident thereon and emit light having the converted wavelength. For example, the light control layer CCL may be a layer including quantum dots or a layer including phosphors.

The light control layer CCL may include multiple partition walls BK spaced apart from each other, and light control areas CCP-B, CCP-G, and CCP-R, disposed between adjacent partition walls BK. The partition wall BK may include a polymer resin and a liquid repellent additive. The partition wall BK may include a light absorbing material or include a pigment or a dye. For example, the partition wall BK may include black pigment or black dye to implement a black partition wall. In forming the black partition wall, carbon black or the like may be used as a black pigment or black dye. However, embodiments are not limited thereto.

The light control layer CCL may include a first light control area CCP-B that transmits a source light emitted from the light-emitting element ED, a second light control area CCP-G including a fourth quantum dot complex QD-C2*a* that converts the source light into a first light, and the third light control area CCP-R including a fifth quantum dot complex QD-C3*a* that converts the source light into a second light. The first light may have a longer wavelength region than that of the source light, and the second light may have a longer wavelength region than that of each of the source light and the first light. For example, the source light may be blue light, the first light may be green light, and the second light may be red light. For example, the fourth quantum dot complex QD-C2*a* may be a green quantum dot and the fifth quantum dot complex QD-C3*a* may be a red quantum dot.

Although not shown, the light control layer CCL may further include scattering particles. The first light control area CCP-B may not include quantum dots and may include the scattering particles. The second light control area CCP-G may include the fourth quantum dot complex QD-C2*a* and the scattering particles. The third light control area CCP-R may include the fifth quantum dot complex QD-C3*a* and the scattering particles.

Each of the first light control area CCP-B, the second light control area CCP-G, and the third light control area CCP-R may include a base resin in which the quantum dots and the scattering particles are dispersed. In an embodiment, the first light control area CCP-B may include the scattering particles dispersed in the base resin. The second light control area CCP-G may include the fourth quantum dot complex QD-C2*a* and the scattering particles dispersed in the base resin. The third light control area CCP-R may include the fifth quantum dot complex QD-C3*a* and the scattering particles dispersed in the base resin.

The light control layer CCL may further include a capping layer CPL. The capping layer CPL may be disposed under the light control areas CCP-B, CCP-G, and CCP-R and the partition wall BK. The capping layer CPL may serve to prevent penetration of moisture and/or oxygen (hereinafter referred to as moisture/oxygen). The capping layer CPL may be disposed on the light control areas CCP-B, CCP-G, and CCP-R to prevent the light control areas CCP-B, CCP-G, and CCP-R from being exposed to moisture/oxygen. The capping layer CPL may include at least one inorganic layer.

Referring to FIG. 4A and FIG. 4B, the optical structure layers PP and PP-1 may each include a base layer BL and a color filter layer CFL.

The base layer BL may provide a base face on which the color filter layer CFL is disposed. The base layer BL may be a glass substrate, a metal substrate, or a plastic substrate. However, embodiments are not limited thereto, and the base layer BL include an inorganic layer, an organic layer, or a composite material layer.

The color filter layer CFL may include color filters CF-B, CF-G, and CF-R. The color filter layer CFL may include a first color filter CF-B that transmits a portion of the source light, a second color filter CF-G that transmits the first light, and a third color filter CF-R that transmits the second light. In another embodiment, the color filter layer CFL may include the first color filter CF-B that transmits blue light, the second color filter CF-G that transmits green light, and the third color filter CF-R that transmits red light. In an embodiment, the first color filter CF-B may be a blue filter, the second color filter CF-G may be a green filter, and the third color filter CF-R may be a red filter.

Each of the color filters CF may include a polymer photosensitive resin and a colorant. The first color filter CF-B may include a blue colorant, the second color filter CF-G may include a green colorant, and the third color filter CF-R may include a red colorant. The first color filter CF-B may include a blue pigment or a blue dye, the second color filter CF-G may include a green pigment or a green dye, and the third color filter CF-R may include a red pigment or a red dye.

The first to third color filters CF-B, CF-G, and CF-R may be disposed to respectively correspond to the first light-emitting area PXA-B, the second light-emitting area PXA-G, and the third light-emitting area PXA-R. The first to third color filters CF-B, CF-G, and CF-R may be disposed to respectively correspond to the first to third light control areas CCP-R, CCP-B, and CCP-G.

The color filters CF-B, CF-G, and CF-R that respectively transmit different color light may be vertically stacked in an overlapping manner in an area corresponding to the peripheral area NPXA disposed between adjacent ones of the light-emitting areas PXA-R, PXA-B, and PXA-G. In the third direction DR3, which may be the thickness direction, the color filters CF-B, CF-G, and CF-R may be vertically arranged so as to overlap each other, and thus to define a boundary between adjacent ones of the light-emitting areas PXA-R, PXA-B, and PXA-G. Accordingly, the stack of color filters CF-B, CF-G, and CF-R may have increased light-blocking effect of external light, and thus, may act as a black matrix. The overlapping stack structure of the color filters CF-B, CF-G, and CF-R may have a function of preventing color mixing.

In an embodiment, the color filter layer CFL may include a light-blocking portion (not shown) which defines the boundary between adjacent ones of the color filters CF-B, CF-G, and CF-R. The light-blocking portion (not shown) may include a blue filter or may include an organic light-blocking material or an inorganic light-blocking material including a black pigment or a black dye.

However, embodiments are not limited thereto, and the first color filter CF-B may not include a pigment or dye. The first color filter CF-B may include a polymer photosensitive resin and may not include a pigment or dye. The first color filter CF-B may be transparent. The first color filter CF-B may be made of a transparent photosensitive resin.

The color filter layer CFL may further include a buffer layer BFL. For example, the buffer layer BFL may be a protective layer that protects the color filters CF-B, CF-G, and CF-R. The buffer layer BFL may be an inorganic material layer including at least one inorganic material selected from silicon nitride, silicon oxide, and silicon oxynitride. The buffer layer BFL may be embodied as a single layer or multiple layers.

Although not illustrated in FIGS. 4A and 4B, in an embodiment, the optical structure layers PP and PP-1 of the display devices DD and DD-1, respectively, may not include the color filter layer CFL. For example, the optical structure layer PP of the display device DD according to an embodiment may include only the base layer BL or may include only the base layer BL and the light control layer CCL.

Although not illustrated in FIG. 4A and FIG. 4B, in an embodiment, the optical structure layers PP and PP-1 of the display devices DD and DD-1, respectively, may include a polarization layer (not shown) instead of the color filter layer CFL. The polarization layer (not shown) may prevent external light provided from the outside from being incident to the display panels DP and DP-1. The polarization layer (not shown) may block a portion of the external light. The polarization layer (not shown) may reduce reflection of the external light from the display panels DP. For example, the external light provided from the outside out of the display device DD may be incident to the display panel DP and the external light may be emitted out of the display panel DP. In this regard, the polarization layer (not shown) may function to prevent the emitted light from being reflected.

Figure 5A:
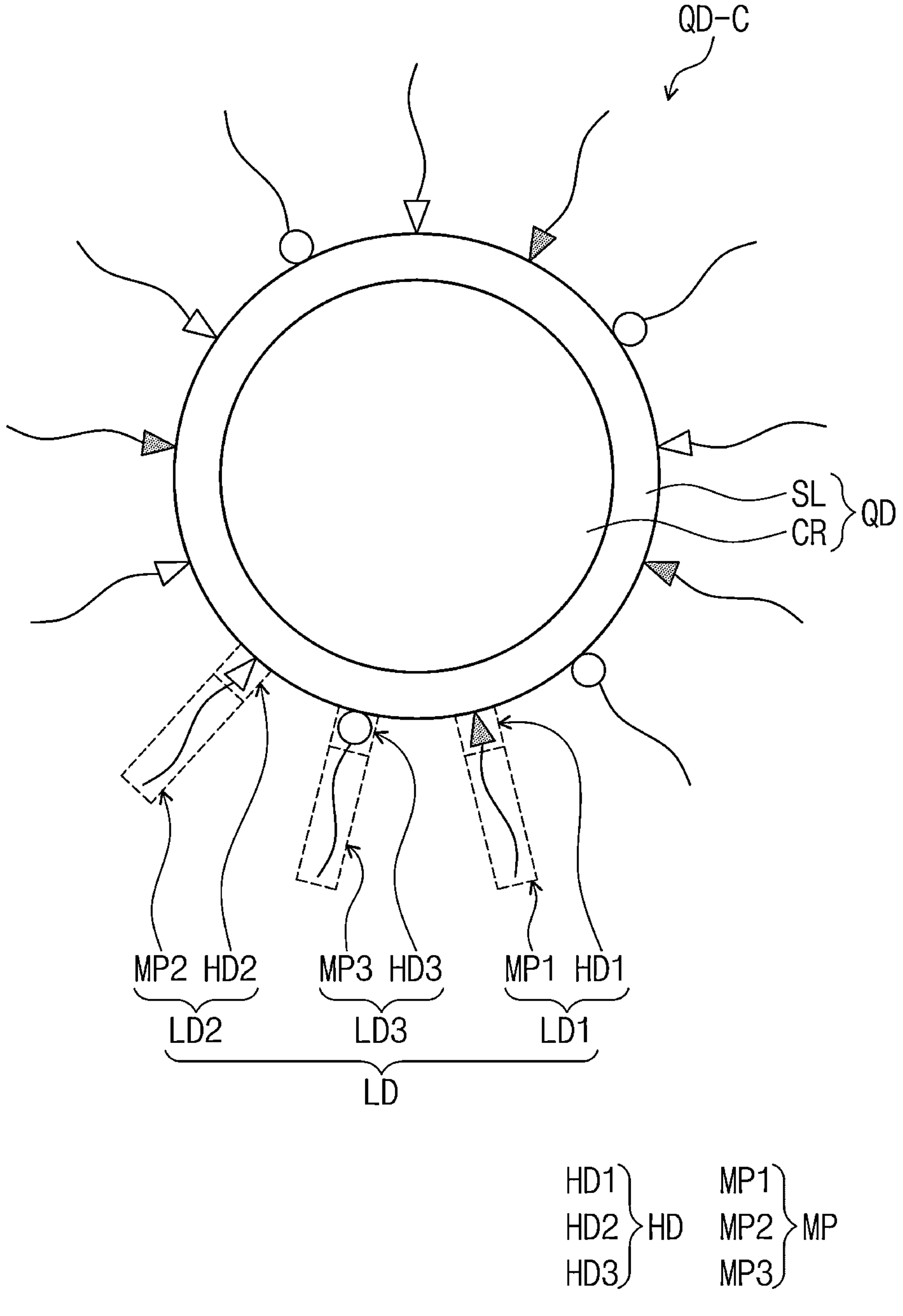
FIG. 5A is a schematic diagram showing a structure of a quantum dot complex according to an embodiment.

FIG. 5A is a schematic diagram showing a structure of the quantum dot complex QD-C according to an embodiment. At least one of the quantum dot complexes QD-C2*a* and QD-C3-*a* respectively included in the light control areas CCP-G and CCP-R as described in FIG. 4A may be the quantum dot complex QD-C according to an embodiment as shown in FIG. 5A. For example, the fourth quantum dot complex QD-C2*a* that converts the source light into the first light may be the quantum dot complex QD-C of FIG. 5A. At least one of the first to third quantum dot complexes QD-C1, QD-C2, and QD-C3 as described above in FIG. 4B may be the quantum dot complex QD-C as shown in FIG. 5A. For example, the second quantum dot complex QD-C2 may be the quantum dot complex QD-C of FIG. 5A.

Referring to FIG. 5A, the quantum dot complex QD-C may include a quantum dot QD and ligands LD binding to a surface of the quantum dot QD. The quantum dot QD may include a core CR and a shell SL surrounding the core CR. The shell SL may entirely cover the core CR.

The quantum dot QD may be a crystal of a semiconductor compound. The quantum dot QD may include any material that can emit light of various wavelengths based on a varying size of the crystal or based on a varying element composition in the compound material of the quantum dot QD.

The quantum dot QD may be synthesized using a wet chemical process, an organic metal chemical vapor deposition process, a molecular beam epitaxy process, or a process similar thereto. The wet chemical process refers to a method of mixing an organic solvent and a precursor material to each other and growing a quantum dot QD particle crystal. When the crystal grows, the organic solvent naturally acts as a dispersant coordinated to a surface of the quantum dot crystal, and controls the growth of the crystal. Thus, the wet chemical process may control the growth of quantum dot QD particle in a process which costs less and may be more readily performed than the vapor deposition schemes such as the organic metal chemical vapor deposition (MOCVD) or the molecular beam epitaxy (MBE).

The quantum dot QD may include a Group II-VI compound, a Group I-II-VI compound, a Group II-IV-VI compound, a Group I-II-IV-VI compound, a Group III-VI compound, a Group I-III-VI compound, a Group III-V compound, a Group III-II-V compound, a Group II-IV-V compound, a Group IV-VI compound, a Group IV group element, a Group IV compound, or any combination thereof.

Examples of the Group II-VI compound may include a binary compound selected from a group consisting of CdS, CdSe, CdTe, ZnS, ZnSe, ZnTe, ZnO, HgS, HgSe, HgTe, MgSe, MgS, and mixtures thereof; a ternary compound selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, and mixtures thereof; or any combination thereof. In an embodiment, the Group II-VI compound may further include a Group I metal and/or a Group IV element. The Group I-II-VI compound may be selected from CuSnS or CuZnS, and the Group II-IV-VI compound may be selected as ZnSnS or the like. The Group I-II-IV-VI compound may be selected from a quaternary compound selected from a group consisting of $Cu_2ZnSnS_2$, $Cu_2ZnSnS_4$, $Cu_2ZnSnSe_4$, $Ag_2ZnSnS_2$, and mixtures thereof.

Examples of the Group III-VI compound may include a binary compound such as GaS, $Ga_2S_3$, GaSe, $Ga_2Se_3$, GaTe, InS, InSe, $In_2Se_3$, InTe, etc., a ternary compound such as $InGaS_3$, $InGaSe_3$, or any combination thereof.

Examples of the Group I-III-VI compound may include a ternary compound selected from a group consisting of AgInS, $AgInS_2$, $AgInSe_2$, AgGaS, $AgGaS_2$, $AgGaSe_2$, CuInS, $CuInS_2$, $CuInSe_2$, $CuGaS_2$, $CuGaSe_2$, $CuGaO_2$, $AgGaO_2$, $AgAlO_2$, and mixtures thereof, or a quaternary compound such as $AgInGaS_2$ and $AgInGaSe_2$.

Examples of the Group III-V compound may include a binary compound selected from a group consisting of GaN, GaP, GaAs, GaSb, AN, AlP, AlAs, AlSb, InN, InP, InAs, InSb and mixtures thereof; a ternary compound selected from a group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and mixtures thereof, and a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In an embodiment, the Group III-V compound may further include a Group II element. An example of the III-V Group semiconductor compound further including the Group II element may include InZnP, InGaZnP, InAlZnP, and the like.

Examples of the Group II-IV-V compound may include a ternary compound selected from a group consisting of $ZnSnP$, $ZnSnP_2$, $ZnSnAs_2$, $ZnGeP_2$, $ZnGeAs_2$, $CdSnP_2$, and $CdGeP_2$, and mixtures thereof.

Examples of the Group IV-VI compound may include a binary compound selected from a group consisting of SnS, SnSe, SnTe, PbS, PbSe, PbTe, and mixtures thereof; a ternary compound selected from a group consisting of SnSeS, SnSeTe, SnSTe, PbSeS, PbSeTe, PbSTe, SnPbS, SnPbSe, SnPbTe, and mixtures thereof; a quaternary compound selected from a group consisting of SnPbSSe, SnPbSeTe, SnPbSTe, and mixtures thereof; or any combination thereof.

Examples of the Group IV element may include Si, Ge, and mixtures thereof. Examples of the Group IV compound may include a binary compound selected from a group consisting of SiC, SiGe, and mixtures thereof.

A binary compound, a ternary compound, or a quaternary compound may be present in a particle at a uniform concentration, or may be present in a particle at a partially different concentration distribution in which the concentration varies based on an area. For example, the chemical formula may mean types of elements included in the compound, and a ratio between the element contents in the compound may vary. For example, $AgInGaS_2$ may mean $AgIn_xGa_{1-x}S_2$ (wherein x is a real number between 0 and 1).

In an embodiment, a quantum dot may have a core/shell structure in which one quantum dot surrounds another quantum dot. A quantum dot having a core/shell structure may have a concentration gradient in which a concentration of a material that is present in the shell decreases toward the core.

In an embodiment, the quantum dot QD may have the aforementioned core/shell structure including a core CR including a nanocrystal and a shell SL surrounding the core CR. The shell SL of the quantum dot QD may serve as a protective layer to prevent chemical denaturation of the core CR to maintain semiconductor characteristics of the core CR, and/or may serve as a charging layer to impart electrophoretic characteristics to the quantum dot. The shell SL may be embodied as a single layer or a multi-layer. In an embodiment, the shell SL may be made of a metal or non-metal oxide, a semiconductor compound, or a combination thereof.

The shell SL may include a different material from that of the core CR. In an embodiment, the core CR may include a first semiconductor nanocrystal, and the shell SL may include a second semiconductor nanocrystal different from the first semiconductor nanocrystal. In another embodiment, the shell SL may include a metal or non-metal oxide. The shell SL may include a metal or non-metal oxide, a semiconductor nanocrystal, or a combination thereof.

The shell SL may be made of a single material, and may be formed to have a concentration gradient. For example, as the shell SL extends toward the core CR, the concentration of the second semiconductor nanocrystal present in the shell SL may decrease. As the core CR extends toward a center thereof, the concentration of the first semiconductor nanocrystal included in the core CR may increase. In an embodiment, FIG. 5A shows that the shell SL has a single-layer structure. However, embodiments are not limited thereto, and the shell SL may include multiple layers including different materials.

In an embodiment, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc., a ternary compound such as $MgAl_2O_4$, $CoFe_2O_4$, $NiFe_2O_4$, $CoMn_2O_4$ etc. or any combination thereof. However, embodiments are not limited thereto.

In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or any combination thereof. However, embodiments are not limited thereto.

Light emitted from the quantum dot QD may have a full width of half maximum (FWHM) of a wavelength spectrum equal to or less than about 45 nm. For example, the quantum dot QD may have a FWHM equal to or less than about 40 nm. For example, the quantum dot QD may have a FWHM equal to or less than about 30 nm. When the FWHM of the quantum dot QD satisfies any of the above-described ranges, color purity or color reproducibility of the quantum dot QD may be improved. Light emitted from the quantum dot QD may be emitted in all directions, such that a wide viewing angle may be improved.

A shape of the quantum dot QD is not limited to shapes of the related art. The quantum dot QD may have a shape including a spherical shape, a pyramidal shape, a multi-arm shape, or a cubic shape, or the quantum dot QD may be in the form of a nanoparticle, a nanotube, a nanowire, a nanofiber, or a nanoplate particle.

An energy band gap of the quantum dot QD may be controlled by adjusting a size of the quantum dot QD or a ratio of contents of elements in the quantum dot QD compound. Thus, a quantum dot QD light-emitting layer may generate light of various wavelengths. Therefore, using the quantum dot QD as described above (for example, varying the size of the quantum dot or the ratio of contents of elements in the quantum dot QD compound) may allow a light-emitting element emitting light of various wavelengths to be implemented. Specifically, the quantum dot QD may emit light of various colors such as blue, red, and green via the control of the size of the quantum dot QD or the ratio of the contents of the elements in the quantum dot QD compound. Light of various colors emitted from the quantum dots QD may be combined with each other to emit white light. As the particle size of the quantum dot QD is smaller, the quantum dot QD may emit light in a short wavelength region. For example, when two quantum dots QD have the same core, a particle size of one of the two quantum dots emitting green light may be smaller than a particle size of the other of the two quantum dots emitting red light. When two quantum dots QD have a same core, a particle size of one of the two quantum dots QD emitting blue light may be smaller than a particle size of the other of the two quantum dots emitting green light. However, embodiments are not limited thereto. When two quantum dots QD have the same core, the particle size of each of the two quantum dots may be adjusted depending on a material constituting the shell and the shell thickness of each of the two quantum dots.

In one example, when quantum dots QD emit light of various colors such as blue, red, and green, the quantum dots QD emitting light of different colors may include different core CR materials.

In an embodiment, the core CR may include a Group III-V compound or a Group I-III-VI compound. For example, the core CR may include InP or AgInGaS. The quantum dot QD according to an embodiment may include the core CR including the Group III-V compound or the Group I-III-VI compound and thus have high blue light absorption.

In an embodiment, the quantum dot QD may be a non-Cd quantum dot. For example, the quantum dot QD may not include cadmium (Cd).

A wavelength of light which the core CR absorbs may be in a range of about 350 nm to about 530 nm. Accordingly, the core CR may absorb blue light in the aforementioned wavelength range and thus may emit green light or red light. A wavelength of light emitted from the quantum dot QD may be controlled by adjusting the size of the core CR and the thickness of the shell SL.

In an embodiment, the quantum dot QD may emit light having a wavelength in a range of about 510 nm to about 540 nm. For example, the quantum dot QD may emit green light having a wavelength in a range of about 510 nm to about 540 nm. However, embodiments are not limited thereto, and the quantum dot QD may emit light having a wavelength in a range of about 630 nm to about 680 nm. For example, the quantum dot QD may emit red light having a wavelength in a range of about 630 nm to about 680 nm. The quantum dot QD may emit light having a target wavelength by controlling contents of elements included in the core CR.

In an embodiment, the quantum dot QD may have a diameter in a range of about 1 nm to about 10 nm. When the quantum dot QD satisfies an average particle diameter range as described above, the quantum dot QD may perform a characteristic behavior and have excellent dispersibility. Thus, variously selecting the average particle diameter of the quantum dot QD within the range as described above may allow the wavelength of light emitted from the quantum dot QD and/or the semiconductor characteristics of the quantum dot to be variously changed.

The quantum dot complex QD-C includes ligands LD bound to the surface of the quantum dot QD. The ligands LD include three different types of ligands. The ligands LD include a first ligand LD1, a second ligand LD2, and a third ligand LD3. As used herein, the first ligand LD1, the second ligand LD2 and the third ligand LD3 may be referred to as "a plurality of polar ligands". A molecular weight of each of the ligands LD may be in a range of about 200 to about 400.

Each of the first ligand LD1 and the second ligand LD2 may include an acid functional group. Each of the first ligand LD1 and the second ligand LD2 may be an organic material including the acid functional group in a molecular structure thereof. The acid functional group included in each of the first ligand LD1 and the second ligand LD2 may be any one of a carboxylic acid group, a thiocarboxylic acid group, a phosphoric acid group, a phosphonic acid group, a boronic acid group, and a sulfonic acid group.

The first ligand LD1 may include a first acid functional group, and the second ligand LD2 may include a second acid functional group. The first acid functional group and the second acid functional group may be the same as or different from each other. For example, each of the first acid functional group and the second acid functional group may be a carboxylic acid group. The first ligand LD1 and the second ligand LD2 may have the same acid functional group in a molecular structure thereof, whereas remaining portions thereof other than the acid functional group may have different structures.

The third ligand LD3 may include a thiol group. The third ligand LD3 may be an organic material including a thiol functional group in its molecular structure.

In the quantum dot complex QD-C, the three different ligands LD may be attached to the surface of the quantum dot QD such that surface characteristics thereof may be modified.

The quantum dot QD included in the quantum dot complex QD-C may include the core CR and the shell SL surrounding the core CR. The ligands LD may be bound to the surface of the shell SL forming a surface of the quantum dot QD.

Each of the ligands LD may include a head HD that binds to the quantum dot QD. In an embodiment, the first ligand LD1 may include a first head HD1, the second ligand LD2 may include a second head HD2, and the third ligand LD3 may include a third head HD3. Each of the first head HD1, the second head HD2, and the third head HD3 may bind to the surface of the quantum dot QD. Each of the first head HD1, the second head HD2, and the third head HD3 may be coupled to a surface of the shell SL.

Each of the first head HD1 and the second head HD2 may include the acid functional group. The first head HD1 may include the first acid functional group, and the second head HD2 may include the second acid functional group. The third head HD3 may include the thiol group. The first head HD1 may consist of the first acid functional group, the second head HD2 may consist of the second acid functional group, and the third head HD3 may consist of the thiol group.

Each of the ligands LD may be a monodentate ligand including one functional group so that the corresponding head HD binds to the surface of the quantum dot QD. For example, each of the first head HD1, the second head HD2, and the third head HD3 may include one functional group for binding to the surface of the quantum dot QD. However, embodiments are not limited thereto, and each of the ligands LD may be a bidentate ligand including two functional groups so that the corresponding head HD binds to the surface of the quantum dot QD. The head HD may include a functional group for binding to the surface of the shell SL of the quantum dot QD, so that the ligand LD may be effectively bound to the quantum dot QD. Each of the first head HD1, the second head HD2, and the third head HD3 may be an electron donor head. Each of the first head HD1, the second head HD2, and the third head HD3 may have a functional group including an anion.

Each of the ligands LD may include a main body MP. The main body MP may have one end connected to the head HD and a distal end opposite to the one end and exposed to an outside out of the quantum dot complex QD-C. The main body MP may include a polar functional group in a structure thereof so that each of the first ligand LD1, the second ligand LD2, and the third ligand LD3 may have a polarity. The main body MP may include a substituted or unsubstituted oxy group, a substituted or unsubstituted (meth)acrylate group, a substituted or unsubstituted alkyl group having 1 to 30 carbon atoms, or a substituted or unsubstituted alkenyl group having 2 to 30 carbon atoms in the structure thereof. The main body MP may include an ethylene glycol group in the structure thereof.

The first ligand LD1 may include a first main body MP1 connected to the first head HD1, and the second ligand LD2 may include a second main body MP2 connected to the second head HD2. The first main body MP1 may be linked to the first acid functional group as described above. The second main body MP2 may be linked to the second acid functional group as described above.

The first main body MP1 and the second main body MP2 may be different from each other. The first main body MP1 and the second main body MP2 may have different molecular structure lengths constituting chain structures, respectively. In an embodiment, the first main body MP1 may include an ethylene glycol group in a structure thereof, and the second main body MP2 may not include an ethylene glycol group in a structure thereof. The second main body MP2 may include at least one of an ester group or a (meth)acrylate group in the structure thereof. The first ligand LD1 and the second ligand LD2 may include the same acid functional group, while the first main body MP1 of the first ligand LD1 connected to the acid functional group and the second main body MP2 of the second ligand LD2 connected to the acid functional group may be different from each other. Accordingly, the first ligand LD1 and the second ligand LD2 may be different from each other.

The third ligand LD3 may include a third main body MP3 connected to the third head HD3. The third main body MP3 may be linked to the thiol group as described above. The third main body MP3 may include an ethylene glycol group in its structure.

Each of the ligands LD may bind to a cation positioned at the surface of the shell SL of the quantum dot QD. In an embodiment, the shell SL include a semiconductor compound selected from a Group II-VI compound, a Group III-VI compound, a Group I-III-VI compound, a Group III-V compound, a Group III-II-V compound, a Group IV-VI compound, a Group IV element, a Group IV compound, and combinations thereof. A cation of a Group I, II, III, or IV element included in the shell SL may bind to the ligand LD. For example, the shell SL may include ZnS or ZnSe, and the ligand LD may bind to a Zn cation included in the shell SL. For example, the head HD of the ligand LD may bind to the Zn cation disposed at the surface of the shell SL. In an embodiment, the shell SL may have a structure including multiple layers in which a first layer adjacent to the core CR includes ZnSe and a second layer disposed on the first layer includes ZnS. When the shell SL has a structure including multiple layers, the head HD of the ligand LD may bind to a cation disposed at a surface of the outermost layer among the layers included in the shell SL.

In the specification, the term "substituted or unsubstituted" may describe a group that is substituted or unsubstituted with one or more substituents selected from the group consisting of a deuterium atom, a halogen atom, a cyano group, a nitro group, an amino group, a silyl group, an oxy group, a thio group, a thiol group, a sulfinyl group, a sulfonyl group, a carbonyl group, a boron group, a phosphine oxide group, a phosphine sulfide group, an alkyl group, an alkenyl group, an alkynyl group, a hydrocarbon ring group, a heterocyclic group, an aryl group, and a heteroaryl group. Each of the substituents listed above may itself be substituted or unsubstituted. For example, a biphenyl group may be interpreted as an aryl group, or it may be interpreted as a phenyl group substituted with a phenyl group.

In the specification, examples of a halogen atom may include a fluorine atom, a chlorine atom, a bromine atom, or an iodine atom.

In the specification, an alkyl group may be linear, branched, or cyclic. The number of carbon atoms in an alkyl group may be in a range of 1 to 50, 1 to 30, 1 to 20, 1 to 10, or 1 to 6. Examples of an alkyl group may include a methyl group, an ethyl group, a n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-icosyl group, a 2-ethyl icosyl group, a 2-butyl icosyl group, a 2-hexyl icosyl group, a 2-octyl icosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, and an n-triacontyl group etc. However, embodiments are not limited thereto.

In the specification, an alkenyl group may be a hydrocarbon group that includes one or more carbon-carbon double bonds at a middle or a terminus of an alkyl group having 2 or more carbon atoms. An alkenyl group may be linear or branched. The number of carbon atoms in an alkenyl group is not limited and may be in a range of 2 to 30, 2 to 20, or 2 to 10. Examples of an alkenyl group may include a vinyl group, a 1-butenyl group, a 1-pentenyl group, a 1,3-butadienyl aryl group, a styrenyl group, and a styrylvinyl group.

In the specification, a thiol group may be an alkyl thiol group or an aryl thiol group. A thiol group may be a sulfur atom that is bonded to a hydrogen atom and is also bonded to an alkyl group or an aryl group as defined above. Examples of a thiol group may include a methylthiol group, an ethylthiol group, a propylthiol group, a pentylthiol group, a hexylthiol group, an octylthiol group, a dodecylthiol group, a cyclopentylthiol group, a cyclohexylthiol group, a phenylthiol group, a naphthyl thiol group, etc. However, embodiments are not limited thereto.

In the specification, an oxy group may be an oxygen atom that is bonded to an alkyl group or an aryl group as defined above. An oxy group may be an alkoxy group or an aryl oxy group. An alkoxy group may be linear, branched, cyclic. The number of carbon atoms in an alkoxy group is not particularly limited, but may be, for example, in a range of 1 to 20, or 1 to 10. Examples of an oxy group may include a methoxy group, an ethoxy group, an n-propoxy group, an isopropoxy group, a butoxy group, a pentyloxy group, a hexyloxy group, an octyloxy group, a nonyloxy group, a decyloxy group, a benzyloxy group, etc. However, embodiments are not limited thereto.

In the specification, the number of carbon atoms in an amine group is not limited, but may be in a range of 1 to 30. An amine group may be an alkyl amine group or an aryl amine group. Examples of an amine group may include a methylamine group, a dimethylamine group, a phenylamine group, a diphenylamine group, a naphthylamine group, a 9-methyl-anthracenylamine group, and a triphenylamine group, etc.

In the specification, the term (meth)acrylate may mean acrylate or methacrylate.

In the specification, the symbols

and ——* each represent a bond to a neighboring atom in a corresponding formula or moiety.

In the quantum dot complex QD-C, the first ligand LD1 may be represented by Chemical Formula 1, and the second ligand LD2 may be represented by Chemical Formula 2.

[Chemical Formula 1]

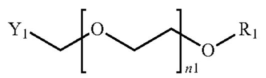

[Chemical Formula 2]

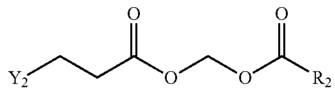

In Chemical Formula 1 and Chemical Formula 2, $Y_1$ may be the first acid functional group; and $Y_2$ may be the second acid functional group. For example, $Y_1$ and $Y_2$ may each independently be a carboxylic acid group, a thiocarboxylic acid group, a phosphoric acid group, a phosphonic acid group, a boronic acid group, or a sulfonic acid group. $Y_1$ and $Y_2$ may be the same or different from each other. For example, both $Y_1$ and $Y_2$ may be carboxylic acid groups.

In Chemical Formula 1 and Chemical Formula 2, $R_1$ may be a substituted or unsubstituted alkyl group having 1 to 20 carbon atoms; and $R_2$ may be a substituted or unsubstituted alkyl group having 1 to 20 carbon atoms or a substituted or unsubstituted alkenyl group having 2 to 20 carbon atoms. For example, $R_1$ may be a substituted or unsubstituted methyl group. For example, $R_2$ may be a substituted or unsubstituted methyl group, a substituted or unsubstituted ethyl group, or a substituted or unsubstituted ethylene group.

In Chemical Formula 1, n1 may be an integer from 1 to 10. For example, n1 may be an integer from 3 to 6. When n1 is greater than or equal to 2, the first ligand LD1 represented by Chemical Formula 1 may include a polyethylene glycol group.

In the quantum dot complex QD-C, the second ligand LD2 may be represented by Chemical Formula 3.

[Chemical Formula 3]

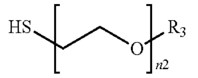

In Chemical Formula 3, $R_3$ may be a substituted or unsubstituted alkyl group having 1 to 20 carbon atoms. For example, $R_3$ may be a substituted or unsubstituted methyl group.

In Chemical Formula 3, n2 may be an integer from 1 to 10. For example, n2 may be an integer from 3 to 6. When n2 is greater than or equal to 2, the third ligand LD3 represented by Chemical Formula 3 may include a polyethylene glycol group.

Figure 5B:
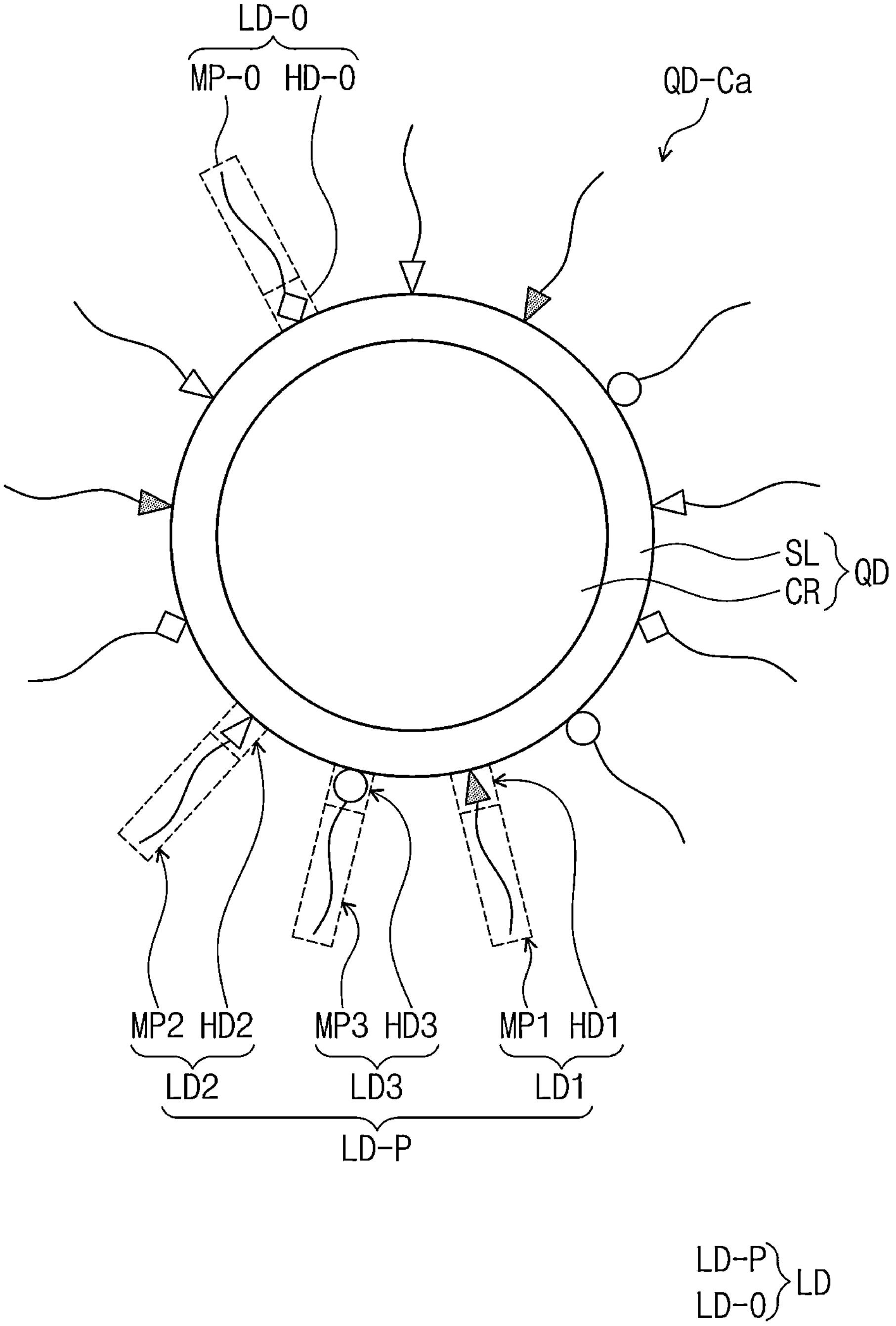
FIG. 5B is a schematic diagram showing a structure of a quantum dot complex according to an embodiment.

FIG. 5B is a schematic diagram showing a structure of a quantum dot complex QD-Ca according to an embodiment. FIG. 5B shows a quantum dot complex different from the quantum dot complex QD-C as shown in FIG. 5A.

Referring to FIG. 5B, ligands LD included in the quantum dot complex QD-Ca may further include a basic ligand LD-O. The basic ligand LD-O may be a ligand remaining without being exchanged in a ligand-exchange process. Unlike the first ligand LD1, the second ligand LD2, and the third ligand LD3, the basic ligand LD-O may be a hydrophobic organic ligand having a non-polar property.

The basic ligand LD-O may include a basic head HD-O and a basic main body MP-O. The basic head HD-O may include at least one functional group to bind to the surface of the quantum dot QD. The basic head HD-O may include a carboxyl group, an amine group, a thiol group, a phosphine group, a phosphonate group, a phosphate group, a phosphine oxide group, and a carboxylic acid group. For example, the basic head HD-O may include a carboxylic acid group.

The basic main body MP-O may be connected to the basic head HD-O. The basic main body MP-O may have one end connected to the basic head HD-O and the other end opposite to the one end and exposed to an outside out of the quantum dot QD. In order for the basic ligand LD-O to have the non-polar property, the basic main body MP-O may include a chain-type alkyl or chain-type alkenyl group having a linear or branched structure. The basic main body MP-O may be a substituted or unsubstituted alkyl group having 1 to 30 carbon atoms or a substituted or unsubstituted alkenyl group having 2 to 30 carbon atoms. The basic main body MP-O may be a substituted or unsubstituted alkyl group having 10 to 30 carbon atoms or a substituted or unsubstituted alkenyl group having 10 to 30 carbon atoms.

The basic ligand LD-O may include methane thiol, ethane thiol, propane thiol, butane thiol, pentane thiol, hexane thiol, octane thiol, dodecane thiol, hexadecane thiol, octadecane thiol, benzyl thiol, methanamine, ethane amine, propane amine, butyl amine, pentyl amine, hexyl amine, octyl amine, dodecyl amine, hexadecyl amine, octadecyl amine, dimethyl amine, diethyl amine, dipropyl amine, oleylamine, trioctyl amine, methanic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, trimethyl phosphine, methyldiphenyl phosphine, triethyl phosphine, ethyl diphenyl phosphine, trioctylphosphine, trimethyl phosphine oxide, methyldiphenyl phosphine oxide, triethyl phosphine oxide, ethyldiphenyl phosphine oxide, and trioctylphosphine oxide. However, embodiments are not limited thereto. The basic ligand LD-O may be, for example, oleic acid. The basic ligand LD-O may be used alone or in a mixture of two or more compounds.

Referring to FIG. 5A and FIG. 5B, a content of the quantum dot QD in each of the quantum dot complexes QD-C and QD-Ca may be in a range of 60 wt % to 80 wt %, and a content of ligands LD in each of the quantum dot complexes QD-C and QD-Ca may be in a range of 20 wt % to 40 wt %, based on a total weight of each of the quantum dot complexes QD-C and QD-Ca. For example, the content of the quantum dot QD may be in a range of 65% by weight to 75% by weight, and the content of ligands LD may be in a range of 25% by weight % to 35% by weight, based on the total weight of each of the quantum dot complexes QD-C and QD-Ca.

According to an embodiment, a sum of contents of the first ligand LD1 and the second ligand LD2 in each of the quantum dot complexes QD-C and QD-Ca may be in a range of 40 weight % to 45 weight %, based on a total weight of ligands LD. The content of the first ligand LD1 in each of the quantum dot complexes QD-C and QD-Ca may be in a range of 10% by weight to 15% by weight, based on the total weight of ligands LD. The content of the second ligand LD2 in each of the quantum dot complexes QD-C and QD-Ca may be in a range of 20% by weight to 35% by weight, based on the total weight of ligands LD. A content of the third ligand LD3 may be in a range of 15% by weight to 20% by weight, based on the total weight of ligands LD.

In an embodiment, as shown in FIG. 5B, the ligands LD in the quantum dot complex QD-Ca may further include the basic ligand LD-O as a non-polar ligand in addition to the first ligand LD1, the second ligand LD2 and the third ligand LD3 as the polar ligands LD-P. A content of the basic ligand LD-O in the quantum dot complex QD-Ca may be in a range of 30% by weight to 50% by weight, based on the total weight of ligands LD. In the ligands LD in the quantum dot complex QD-Ca, the basic ligand LD-O may be a remainder of the ligands LD less a sum of the contents of the first ligand LD1, the second ligand LD2, and the third ligand LD3 as the polar ligands LD-P in the quantum dot complex QD-Ca.

Each of the quantum dot complexes QD-C and QD-Ca of an embodiment includes the ligands LD bound to the surface of the quantum dot QD, wherein the ligands LD includes the first ligand LD1 and the second ligand LD2, each of the first ligand LD1 and the second ligand LD2 including the acid functional groups, and the third ligand LD3 including the thiol group. In the ligands LD included in each of the quantum dot complexes QD-C and QD-Ca, the sum of the contents of the first ligand LD1 and the second ligand LD2, each of the first ligand LD1 and the second ligand LD2 including the acid functional groups, and the content of the third ligand LD3 including the thiol group may be adjusted within the above ranges, such that a quantum yield may be maintained at an excellent level, and crystal stability may be improved. Each of the quantum dot complexes QD-C and QD-Ca of an embodiment may include the ligands LD including three different polar ligands bound to the surface of the quantum dot QD, wherein the content range of each of the polar ligands may be in the ranges as defined above. Thus, when each of the quantum dot complexes QD-C and QD-Ca is applied to the display device and is subjected to a heat treatment process, a high light efficiency may be maintained. A free-ligand released after the heat treatment process may be prevented from recombining onto the surface of the quantum dot QD, thereby preventing overshoot in the light efficiency. Thus, both a process maintaining percentage and a light maintaining percentage of each of the quantum dot complexes QD-C and QD-Ca may be improved.

Hereinafter, a method for preparing a quantum dot complex according to an embodiment will be described with reference to the drawings.

Figure 6:
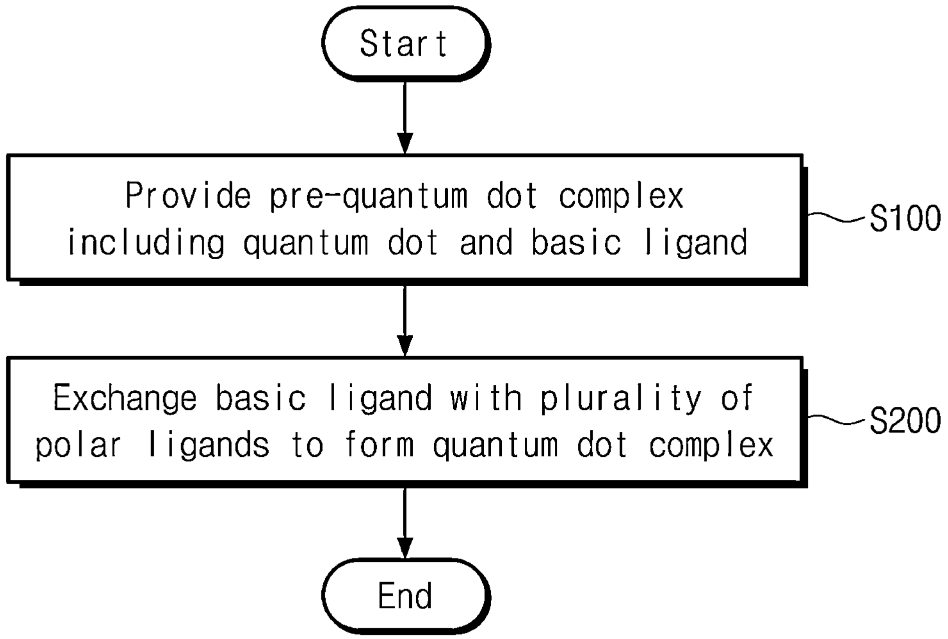
FIG. 6 is a flowchart showing a method for preparing a quantum dot complex according to an embodiment.
Figure 7:
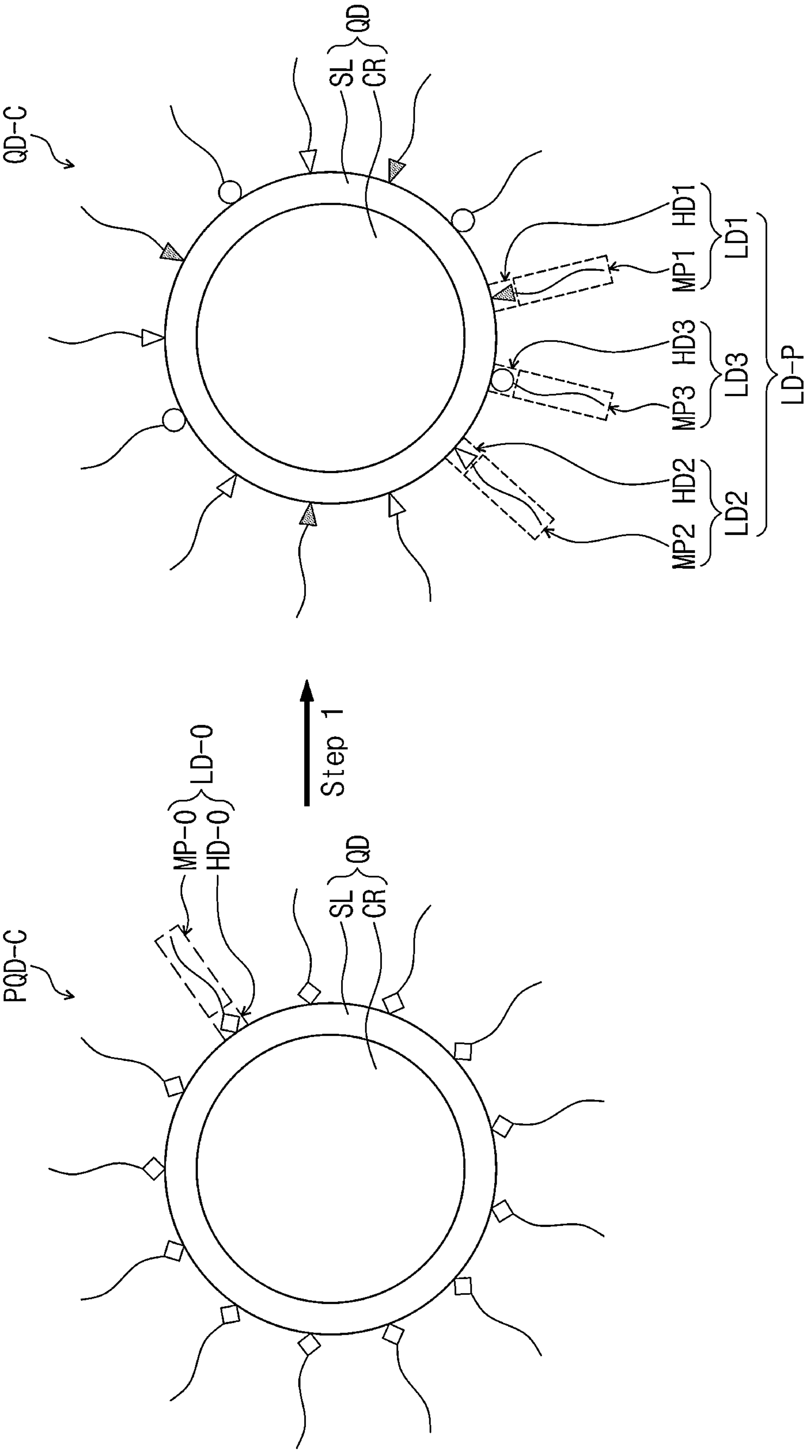
FIG. 7 is a schematic diagram showing one step of a method for preparing a quantum dot complex according to an embodiment.

FIG. 6 is a flowchart showing a method for preparing a quantum dot complex according to an embodiment. FIG. 7 is a schematic diagram showing one step of a method for preparing a quantum dot complex according to an embodiment.

Referring to FIG. 6, the method for preparing the quantum dot complex according to an embodiment includes providing a pre-quantum dot complex in S100 and forming the quantum dot complex in S200.

The method for preparing the quantum dot complex according to an embodiment may include providing the pre-quantum dot complex in S100. First, in providing the pre-quantum dot complex in S100, a step of forming the core may be performed first. The core may include a semiconductor compound selected from a Group II-VI compound, a Group III-VI compound, a Group I-III-VI compound, a Group III-V compound, a Group III-II-V compound, a Group IV-VI compound, a Group IV element, a Group IV compound, or a combination thereof. In an embodiment, the core may include a Group III-V compound or a Group I-III-VI compound. For example, the core may include InP or AgInGaS.

The core may be prepared by reacting a first precursor as a cation precursor and a second precursor as an anion precursor constituting the semiconductor compound with each other. Each of the first precursor and the second precursor may include at least one. For example, when the core includes InP, the core may be formed by reacting the first precursor including In and the second precursor including P with each other.

The first precursor may include a Group I precursor, a Group II precursor, a Group III precursor, or a Group IV precursor, or may be a metal powder, a metal halide, a metal sulfate, a metal acetylacetonate, a metal hydroxide, a metal oxide, a metal nitrate, a metal carboxylate, an alkylating metal compound, and any combination thereof.

The Group I precursor may be one or more selected from the group consisting of silver halide, silver acetate, and silver nitrate. For example, the silver precursor may be silver iodide (AgI). However, embodiments are not limited thereto.

The Group II precursor may include a zinc precursor. The zinc precursor may include, for example, one or more selected from the group consisting of dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, and zinc sulfate. However, embodiments are not limited thereto.

The Group III precursor may include one or more selected from the group consisting of aluminum phosphate, aluminum acetylacetonate, aluminum chloride, aluminum fluoride, aluminum oxide, aluminum nitrate, aluminum sulfate, gallium nitride, gallium phosphide, gallium chloride, gallium acetylacetonate, gallium bromide, gallium chloride, gallium fluoride, gallium iodide, gallium nitrate hydrate, gallium sulfate, gallium sulfate hydrate, indium(III) acetylacetonate, indium(III) chloride, indium(III) iodide, indium (III) acetate, trimethyl indium, alkyl indium, aryl indium, indium myristate, indium(III) myristate acetate, and indium (III) myristate 2 acetate. However, the embodiments are not limited thereto. In an embodiment, the group III precursor may include gallium.

The second precursor may include a Group VI precursor or a Group V precursor or may be a metal powder, a metal halide, a metal sulfate, a metal acetylacetonate, a metal hydroxide, a metal oxide, a metal nitrate, a metal carboxylate, an alkylated metal compound, and any combination thereof.

The Group V precursor may include at least one selected from the group consisting of alkyl phosphine, tris(trialkylsilyl)phosphine, tris(dialkylsilyl)phosphine, tris(dialkylamino)phosphine, arsenic oxide, arsenic chloride, arsenic sulfate, arsenic bromide, and arsenic iodide. However, the embodiments are not limited thereto. For example, the alkyl phosphine may be at least one of triethyl phosphine, tributyl phosphine, trioctyl phosphine, triphenyl phosphine and tricyclohexyl phosphine.

The Group VI precursor may include at least one selected from the group consisting of sulfur, trialkylphosphine sulfide, trialkenylphosphine sulfide, alkylamino sulfide, alkenylamino sulfide, alkyl thiol, selenium, trialkylphosphine selenide, trialkenylphosphine selenide, alkylamino selenide, alkenylamino selenide, trialkylphosphine telluride, trialkenylphosphine telluride, alkylamino telluride and alkenylamino telluride. However, the embodiments are not limited thereto.

The step of forming the core may include a step of mixing the first precursor and the second precursor with each other and a step of heat-treating the mixture thereof. For example, the mixture of the first precursor and the second precursor may be heat-treated at 240° C. or higher. The step of forming the core may include a step of reacting the first precursor and the second precursor with each other. The first precursor and the second precursor may react each other to form the core CR (see FIG. 5A and FIG. 5B).

In an embodiment, a step of preparing a mixture of the first precursor and/or the second precursor and the basic ligand may be performed before or after the step of reacting the first precursor and the second precursor with each other. For example, before the step of reacting the first precursor and the second precursor with each other, the first precursor may be dispersed in the basic ligand to provide a mixture. The basic ligand may be a material that coordinates to a surface of a pre-quantum dot complex PQD-C (see FIG. 7) to be prepared later, and improves dispersibility of the pre-quantum dot complex PQD-C (see FIG. 7) in a hydrophobic solvent.

In an embodiment, the basic ligand may include any one of RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, and $R_2POOH$. In this regard, each of R and R' may correspond to a second connection portion CN2. In an embodiment, each of R and R' corresponding to the second connection portion CN2 may independently be a substituted or unsubstituted alkyl group having 1 to 30 carbon atoms or a substituted or unsubstituted alkenyl group having 2 to 30 carbon atoms.

Examples of a basic ligand may include methane thiol, ethane thiol, propane thiol, butane thiol, pentane thiol, hexane thiol, octane thiol, dodecane thiol, hexadecane thiol, octadecane thiol, benzyl thiol, methanamine, ethaneamine, propane amine, butylamine, pentylamine, hexylamine, octyl amine, dodecyl amine, hexadecyl amine, octadecyl amine, dimethyl amine, diethyl amine, dipropyl amine, oleylamine, trioctylamine, methane acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, trimethyl phosphine, methyldiphenyl phosphine, triethyl phosphine, ethyl diphenyl phosphine, trioctylphosphine, trimethyl phosphine oxide, methyldiphenyl phosphine oxide, triethyl phosphine oxide, ethyldiphenyl phosphine oxide, and trioctylphosphine oxide. However, the embodiments are not limited thereto. The basic ligand may be used alone or in a mixture of two or more.

For example, before the step of reacting the first precursor and the second precursor with each other, a step of dissolving the first precursor in an auxiliary solvent may be performed. However, the embodiments are not limited thereto. When the first precursor is dissolved in the auxiliary solvent in advance, the auxiliary solvent as used may include at least one of hexane, toluene, chloroform, dimethyl sulfoxide, cyclohexylbenzene, hexadecane, and dimethylformamide formamide. However, embodiments are not limited thereto.

The method for preparing the quantum dot complex body according to an embodiment may further include a step of purifying the prepared core after the step of forming the core. The purification step may be performed using chloroform, ethanol, acetone, or any combination thereof. However, the embodiments are not limited thereto. In the method for preparing the quantum dot complex, the step of purifying the core may be omitted depending on a process condition.

A step of forming the shell may be performed after the step of forming the core. The shell may include a semiconductor compound selected from a Group II-VI compound, a Group III-VI compound, a Group I-III-VI compound, a Group III-V compound, a Group III-II-V compound, a Group IV-VI compound, a Group IV element, a Group IV compound, and any combination thereof. In an embodiment, the shell may include II-V compound. The shell may be made of a Group III-VI compound. For example, the shell may include ZnSeS. The shell has a two-layer structure, wherein a first shell layer adjacent to the core may include ZnSe, and a second shell layer formed on a surface of the first shell layer may include ZnS.

The shell may be prepared by reacting a third precursor as a cation precursor and a fourth precursor as an anion precursor constituting the semiconductor compound with each other. Each of the third precursor and the fourth precursor may be at least one. For example, when the shell includes ZnSeS, the shell may be formed by reacting the third precursor including Zn and the fourth precursor including Se and S with each other. The above description about the first precursor may be equally applied to the third precursor. The above description about the second precursor may be equally applied to the fourth precursor.

The step of forming the shell may include a step of adding the third precursor and the fourth precursor to a solution including the core. The third precursor and the fourth precursor may be added to a solution in which the purified cores are dispersed in a solvent and heat treatment may be performed thereon. Accordingly, the shell surrounding the core may be formed by reacting the core with the third precursor and the fourth precursor. Thus, the pre-quantum dot complex PQD-C (see FIG. 7) including the quantum dot including the core and the shell surrounding the core and the first ligand bound to the surface of the quantum dot may finally be obtained.

The method for preparing the quantum dot complex according to an embodiment may further include a step of purifying the quantum dot including the core and the shell surrounding the core after the step of forming the shell. The purification step may be performed using chloroform, ethanol, acetone, and any combination thereof. However, the embodiments are not limited thereto. In the method for preparing the quantum dot complex, the step of purifying the quantum dot may be omitted depending on a process condition. In one example, when the shell included in the quantum dot has a multilayer structure, the above-described step of forming the shell may be performed at least twice, and the third precursor and the fourth precursor may be appropriately selected in consideration of a desired composition.

Preparing the quantum dot complex according to an embodiment, after the step of providing the pre-quantum dot complex in S100, the step of forming the quantum dot complex via a ligand-exchange process in S200 may be performed. The step of forming the quantum dot complex may include a step of exchanging the basic ligand coupled to the pre-quantum dot complex with polar ligands including a hydrophilic group. After the step of forming the pre-quantum dot complex, the basic ligand bound to the pre-quantum dot complex may be replaced with the polar ligands. For example, the polar ligands may correspond to the first ligand LD1, the second ligand LD2, and the third ligand LD3 as described above in FIG. 5A and FIG. 5B. Descriptions regarding the polar ligands may refer to the above descriptions about the first ligand LD1, the second ligand LD2, and the third ligand LD3.

The step of forming the quantum dot complex in S200 may include adding the polar ligand to a solution including the pre-quantum dot complex and a first solvent to react the pre-quantum dot complex with the polar ligand with each other. A first mixture including the pre-quantum dot complex, the first solvent, and the polar ligands may be prepared, and the first mixture may be heated at a first temperature. Accordingly, the basic ligand bound to the pre-quantum dot complex may be removed therefrom, and the polar ligands may be bound to the surface of the quantum dot to form the quantum dot complex QD-C (see FIG. 7). The first temperature is not limited, but may be, for example, in a range of 50° C. to 90° C.

The first solvent is not limited as long as it may dissolve the pre-quantum dot complex. For example, the first solvent may include at least one of cyclohexyl acetate, hexane, toluene, chloroform, dimethyl sulfoxide, cyclohexylbenzene, hexadecane and dimethyl formamide. However, embodiments are not limited thereto.

The method for preparing a quantum dot complex according to an embodiment may further include a step of purifying the quantum dot complex after the step of forming the quantum dot complex. The purification step may be performed using chloroform, ethanol, acetone, or any combination thereof. However, embodiments are not limited thereto. In the method for preparing the quantum dot complex, the step of purifying the quantum dot may be omitted depending on a process condition.

In an embodiment, the polar ligands coupled to the quantum dot surface may be maintained so as to be bound to the surface of the quantum dot complex.

FIG. 7 is a diagram showing one step of a quantum dot preparing method according to an embodiment. FIG. 7 shows a step of forming a quantum dot complex in the quantum dot complex preparing method of an embodiment. In the description of FIG. 7, contents duplicate with the contents as described in FIG. 5A and FIG. 5B and FIG. 9 are not described again, and differences therebetween are described.

In FIG. 7, "Step 1" represents the step of forming the quantum dot complex.

Referring to Step 1, the pre-quantum dot complex PQD-C may be provided. Descriptions of the pre-quantum dot complex PQD-C may be found by referring to the corresponding descriptions as set forth with reference to FIG. 6. For example, the pre-quantum dot complex PQD-C may include the quantum dot QD and the basic ligand LD-O bound to the surface of the quantum dot QD. The basic ligand LD-O may include the basic head HD-O bonded to the surface of the quantum dot QD and the basic main body MP-O connected to the basic head HD-O. As used herein, the basic ligand LD-O may be referred to as an organic ligand.

The basic head HD-O may include a carboxy group, an amine group, a thiol group, a phosphine group, a phosphonate group, a phosphate group, a phosphine oxide group, and a carboxylic acid group.

The basic main body MP-O may be connected to the basic head HD-O. The basic head HD-O may be coupled to the surface of the quantum dot QD. One end of the basic main body MP-O may be connected to the basic head HD-O, while the other end thereof opposite to the one end may be exposed to the outside out of the quantum dot QD. The basic main body MP-O may be a substituted or unsubstituted alkyl group having 1 to 30 carbon atoms or a substituted or unsubstituted alkenyl group having 2 to 30 carbon atoms.

In order to exchange the basic ligand LD-O bound to the surface of quantum dot QD with the polar ligand LD-P including a polar group, the pre-quantum dot complex PQD-C may react with the polar ligand LD-P. In a step of reacting the pre-quantum dot complex PQD-C with the polar ligand LD-P, at least a portion of the basic ligand LD-O bound to the surface of the quantum dot QD may be removed therefrom, and the polar ligand LD-P may be bound to the surface of the quantum dot QD. Accordingly, the quantum dot complex QD-C including the quantum dot QD and the polar ligand LD-P bound to the surface of the quantum dot QD may be formed. For example, after the ligand exchange step, a portion of the basic ligand LD-O may not be exchanged with the polar ligand LD-P, but may remain and be bound to the surface of the quantum dot QD.

For example, the polar ligand LD-P may include the first ligand LD1, the second ligand LD2 and the third ligand LD3. Descriptions about the first ligand LD1, the second ligand LD2, and the third ligand LD3 may refer to the descriptions as set forth above with reference to FIG. 5A and FIG. 5B. For example, in the quantum dot complex QD-C formed using the method for preparing the quantum dot complex, when a total weight of the basic ligand LD-O contained in the pre-quantum dot complex PQD-C is 100% by weight, a sum of the contents of the first ligand LD1 and the second ligand LD2 included in the quantum dot complex QD-C is in a range of 40% by weight to 45% by weight. When the total weight of the basic ligand LD-O contained in the pre-quantum dot complex PQD-C is 100% by weight, the content of the first ligand LD1 included in the quantum dot complex QD-C may be in a range of 10% by weight to 15% by weight. When the total weight of the basic ligand LD-O contained in the pre-quantum dot complex PQD-C is 100% by weight, the content of the second ligand LD2 included in the quantum dot complex QD-C may be in a range of 20% by weight to 35% by weight. When the total weight of the basic ligand LD-O contained in the pre-quantum dot complex PQD-C is 100% by weight, the content of the third ligand LD3 included in the quantum dot complex QD-C may be in a range of 15 wt % to 20 wt %.

Charge carriers may be trapped on the surface of the quantum dot QD under influence of dangling bonds, atomic vacancy, and the like such that light-emitting efficiency thereof may be reduced. The presence of dangling bonds and atomic vacancy in the quantum dot may cause non-radiative recombination to decrease light-emitting efficiency. A method of passivating surface defects of the quantum dot may include a method of introducing an organic ligand in quantum dot synthesis. Long-chain organic ligand such as oleic acid and oleylamine may have the effect of effectively passivating the surface defects of the quantum dot while uniformly dispersing the quantum dots in a hydrophobic solvent. However, when the organic ligand-protected quantum dot is mixed with a hydrophilic solvent to convert the quantum dot into ink, affinity between the hydrophobic organic ligand and the hydrophilic solvent is low, such that stability of the quantum dot particle may be decreased, and aggregation of quantum dots may occur. When a hydrophobic organic ligand is exchanged with a hydrophilic ligand via the ligand-exchange process, the stability of the quantum dot protected with the hydrophilic ligand may be improved due to high affinity with a hydrophilic solvent. However, there may be a problem that light-emitting efficiency is decreased due to surface defects due to migration and detachment of the ligand, or the free-ligand that has been released may be recombined with the quantum dot surface under light to cause the over-shoot.

According to an embodiment, a method for preparing the quantum dot complex includes a step of exchanging a non-polar basic ligand bound to a surface of a quantum dot with polar ligands, wherein the polar ligands may include three different types of ligands, wherein each of a sum of the contents of the first ligand and the second ligand, each including the acid functional group, and the content of the third ligand including the thiol group is controlled within the above defined range. Accordingly, even when the quantum dot complex prepared using the method for preparing the quantum dot complex of an embodiment is applied to the display device and is subjected to a heat treatment process, a high light efficiency may be maintained. The free-ligand released after the heat treatment process may be prevented from recombining onto the surface of the quantum dot QD, thereby preventing overshoot in the light efficiency Hereinafter, a quantum dot according to an embodiment will be described in detail with reference to the Examples and the Comparative Examples. The Examples described below only provided as illustrations to assist in understanding the disclosure, and the scope thereof is not limited thereto.

Table 1 shows evaluations of the light efficiency, process maintaining percentage, and a light maintaining percentage of a quantum dot ink pattern including the quantum dot complex according to the Examples and Comparative Examples. The quantum dot complex of each of Examples and Comparative Examples may be obtained by exchanging a portion of the basic ligand LD-O included in the pre-quantum dot complex PQD-C with the polar ligand LD-P according to a substitution ratio as shown in Table 1 below via the ligand exchange process as shown in FIG. 7. The quantum dot complex according to each of the Examples and Comparative Examples includes a quantum dot having InP as a core material and having a ZnSe/ZnS bilayer shell structure. In the quantum dot complex according to each of the Examples and Comparative Examples, the basic ligand is oleic acid and is represented by a following Chemical Formula O.

[Chemical Formula O]

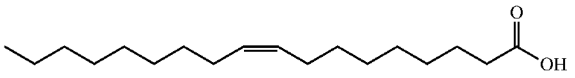

460 nm excitation light at an intensity of 60 mW/cm$^2$ was irradiated to a light conversion pattern prepared in each of Examples and Comparative Examples for 500 hours, and a light conversion efficiency was measured. The light maintaining percentage after 500 hours compared to an initial measured value was calculated and was indicated in Table 1. A quantum dot ink pattern including the quantum dot complex according to each of Examples and Comparative Examples was applied on a glass substrate and was subjected to a baking process. A light conversion efficiency was measured. The process maintaining percentage after the baking process compared to an initial measured value was calculated and was indicated in Table 1.

In Table 1, the light conversion efficiency before irradiating the excitation light to the quantum dot is measured as the initial light conversion efficiency, and the light maintaining percentage (%) refers to a percentage by which the initial light conversion efficiency is maintained. The light maintaining percentage may be calculated according to Equation 1 below.

$$\text{light maintaining percentage}\,(\%) = X_1/X_0 * 100 \qquad \text{[Equation 1]}$$

In the Equation 1, $X_1$ is a quantum yield measured after irradiating the quantum dot complex with 460 nm excitation light at a light intensity of 60 mW/cm$^2$ for 500 hours, and $X_0$ is a quantum yield measured before irradiation of the excitation light.

The light conversion efficiency was measured with a CAS 140 CT spectrometer. A bare glass was disposed on a blue BLU (455 nm) covered with a diffusing film. A detector was used to perform measurement to set a reference, and a light-emitting peak area of converted light relative to a blue light absorption peak area was calculated and measured. For example, light conversion efficiency (power conversion efficiency, PCE) of each of Examples and Comparative Examples may be calculated based on Equation 1 below.

$$PCE\ (\%) = (A_2/A_1) * 100 \qquad \text{[Equation 1]}$$

In Equation 1, $A_1$ denotes an area of a blue light absorption spectrum, and $A_2$ denotes an area of a light-emitting spectrum of the converted light. For example, $A_1$ may correspond to an absorption peak area of blue light absorbed by the quantum dot. $A_2$ may correspond to a light-emitting peak area of light converted by the quantum dot.

TABLE 1

| Examples | Ligand (substitution ratio) | Initial light conversion efficiency (%) | Light conversion efficiency (%) after baking process | Process maintaining percentage (%) | Light maintaining percentage (%) | Remarks |
|---|---|---|---|---|---|---|
| Example 1 | mPEG4-COOH (15 wt %) + MAS (30 wt %) + mPEG5-SH (15 wt %) | 37.60% | 33.85% | 90.00% | 101.20% | Productivity, and reliability being improved |
| Example 2 | mPEG4-COOH (10 wt %) + MAS (30 wt %) + mPEG5-SH (20 wt %) | 37.62% | 33.83% | 90.20% | 96.40% | Productivity and reliability being improved |
| Comparative Example 1 | mPEG4-COOH (30 wt %) | 30.60% | X | X | X | Ink dispersibility being lowered |
| Comparative Example 2 | MAS (30 wt %) | X | X | X | X | Solubility with monomer being lowered |

TABLE 1-continued

| Examples | Ligand (substitution ratio) | Initial light conversion efficiency (%) | Light conversion efficiency (%) after baking process | Process maintaining percentage (%) | Light maintaining percentage (%) | Remarks |
|---|---|---|---|---|---|---|
| Comparative Example 3 | mPEG4-COOH (30 wt %) + MAS (30 wt %) | 37.01% | 31.72% | 85.70% | 116.80% | Productivity being lowered Reliability: OVERSHOOT |
| Comparative Example 4 | MAS (30 wt %) + mPEG5-SH (30 wt %) | 37.90% | 34.46% | 90.90% | 67.90% | Productivity being excellent Reliability being lowered |
| Comparative Example 5 | mPEG4-COOH (5 wt %) + MAS (30 wt %) + mPEG5-SH (25 wt %) | 37.92% | 34.25% | 90.32% | 68.30% | Productivity being excellent Reliability being lowered |
| Comparative Example 6 | mPEG4-COOH (15 wt %) + MAS (15 wt %) + mPEG5-SH (30 wt %) | 37.87% | 34.38% | 90.78% | 72.31% | Productivity being excellent Reliability being lowered |
| Comparative Example 7 | mPEG4-COOH (20 wt %) + MAS (30 wt %) + mPEG5-SH (10 wt %) | 37.54% | 33.78% | 89.50% | 105.20% | Productivity being lowered Reliability: OVERSHOOT |

In the Table 1, mPEG4-COOH is represented by a following Chemical Formula 1a, MAS is represented by a following Chemical Formula 2a, and mPEG5-SH is represented by a following Chemical Formula 3a:

[Chemical Formula 1a]

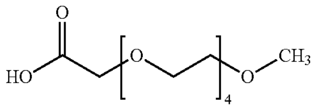

[Chemical Formula 2a]

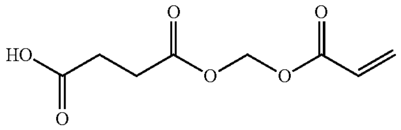

[Chemical Formula 3a]

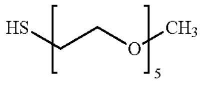

Referring to the results of Table 1, each of the Examples as prepared by a method for preparing a quantum dot complex in an embodiment has excellent process maintaining percentage and light maintaining percentage, and has no overshoot defect, compared to Comparative Examples.

The light conversion pattern formed using the quantum dot complex of each of the Examples includes the first ligand mPEG4-COOH, the second ligand MAS, and the third ligand mPEG5-SH as set forth above in the above description. The content of each of the first to third ligands is within the range defined above. Thus, the process maintaining percentage is excellent, for example, 90% or higher. The light maintaining percentage is in a range of 90% to 105%. Thus, reliability deterioration or overshoot are prevented.

The light conversion pattern formed using the quantum dot complex of Comparative Example 1 had poor dispersibility of the quantum dot complexes in the ink. Thus, a coating film of the light conversion pattern was not formed. Thus, it was impossible to measure the light conversion efficiency after the baking process. In the quantum dot complex of Comparative Example 2, solubility of the quantum dot ink in the base monomer was decreased, so that light conversion efficiency could not be measured.

Unlike the quantum dot complex of each of the Examples, the quantum dot complex of Comparative Example 3 is free of the third ligand, for example, the ligand including the thiol group. Thus, it may be identified that the quantum dot complex of Comparative Example 3 has reduced process maintaining percentage and the light maintaining percentage exceeding 105%, resulting in an overshoot defect. Unlike the quantum dot complex of each of the Examples, the quantum dot complex of Comparative Example 4 has only one ligand containing an acid functional group. Thus, it may be identified that the quantum dot complex of Comparative Example 4 has the light maintaining percentage which falls below 70%.

Like the quantum dot complex of each of the Examples, the quantum dot complex of each of Comparative Example 5 and Comparative Example 6 includes the first to third ligands, wherein the content of each of the first ligand and the second ligand is smaller than the aforementioned range, and the content of the third ligand exceeds the above-mentioned range. Thus, it may be identified that the quantum dot complex of each of Comparative Example 5 and Comparative Example 6 has a light maintaining percentage which falls below 75%.

Like the quantum dot complex of each of the Examples, the quantum dot complex of Comparative Example 7 includes the first to third ligands, wherein the content of each of the first ligand and the second ligand exceeds the aforementioned range, and the content of the third ligand is less than the above-mentioned range. Thus, it may be identified that the quantum dot complex of Comparative Example 7 has a process maintaining percentage lower than 90% and a light maintaining percentage exceeding 105% such that the overshoot defect occurs.

The quantum dot complex according to an embodiment may include the three different types of ligands in a specific ratio to exhibit excellent productivity and reliability.

The method for preparing the quantum dot complex according to an embodiment may provide the quantum dot complex exhibiting high quantum yield and excellent stability.

The display device according to an embodiment may include the quantum dot complex exhibiting high quantum yield and excellent stability and thus may exhibit improved light-emitting efficiency characteristics.

Embodiments have been disclosed herein, and although terms are employed, they are used and are to be interpreted in a generic and descriptive sense only and not for purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A quantum dot complex comprising:

a quantum dot; and a plurality of ligands binding to a surface of the quantum dot, wherein the plurality of ligands include:

a first ligand including a first acid functional group;

a second ligand including a second acid functional group different from the first acid functional group; and a third ligand including a thiol group, a sum of the first ligand and the second ligand contained in the plurality of ligands is in a range of 40% by weight to 45% by weight, based on a total weight of the plurality of ligands binding to the surface of the quantum dot, a content of the third ligand in the plurality of ligands is in a range of 15% by weight to 20% by weight, based on the total weight of the plurality of ligands binding to the surface of the quantum dot.

2. The quantum dot complex of claim 1, wherein the plurality of ligands further include a basic ligand including a non-polar functional group.

3. The quantum dot complex of claim 1, wherein each of the first acid functional group, the second acid functional group, and the thiol group binds to the surface of the quantum dot.

4. The quantum dot complex of claim 1, wherein the first ligand includes a first main body linked to the first acid functional group, the second ligand includes a second main body linked to the second acid functional group, and the first main body and the second main body are different from each other.

5. The quantum dot complex of claim 1, wherein the third ligand includes a third main body linked to the thiol group.

6. The quantum dot complex of claim 1, wherein the first ligand is represented by Chemical Formula 1:

[Chemical Formula 1]

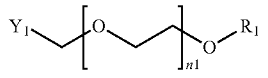

wherein in Chemical Formula 1, $Y_1$ is the first acid functional group, $R_1$ is a substituted or unsubstituted alkyl group having 1 to 20 carbon atoms, and n1 is an integer from 1 to 10.

7. The quantum dot complex of claim 1, wherein the second ligand is represented by Chemical Formula 2:

[Chemical Fomula 2]

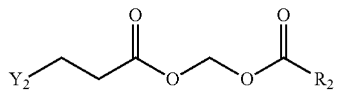

wherein in Chemical Formula 2, $Y_2$ is the second acid functional group, and $R_2$ is a substituted or unsubstituted alkyl group having 1 to 20 carbon atoms or a substituted or unsubstituted alkenyl group having 2 to 20 carbon atoms.

8. The quantum dot complex of claim 1, wherein the third ligand is represented by Chemical Formula 3:

[Chemical Formula 3]

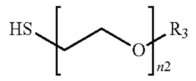

wherein in Chemical Formula 3, $R_3$ is a substituted or unsubstituted alkyl group having 1 to 20 carbon atoms, and n2 is an integer from 1 to 10.

9. The quantum dot complex of claim 1, wherein the quantum dot includes a core, and a shell surrounding the core, and each of the plurality of ligands binds to a surface of the shell.

10. The quantum dot complex of claim 9, wherein the core includes a first semiconductor nanocrystal, the shell includes a second semiconductor nanocrystal different from the first semiconductor nanocrystal, and the first semiconductor nanocrystal and the second semiconductor nanocrystal are each independently a Group II-VI compound, a Group III-VI compound, a Group I-III-VI compound, a Group III-V compound, a Group III-II-V compound, a Group IV-VI compound, a Group IV element, a Group IV compound, or a combination thereof.

11. The quantum dot complex of claim 9, wherein the core includes InP or AgInGaS.

12. The quantum dot complex of claim 1, wherein a molecular weight of each of the plurality of ligands is in a range of 200 to 400.

13. The quantum dot complex of claim 1, wherein a content of the first ligand in the plurality of ligands is in a range of 10% by weight to 15% by weight, based on the total weight of the plurality of ligands, and a content of the second ligand in the plurality of ligands is in a range of 25% by weight to 35% by weight, based on the total weight of the plurality of ligands.

14. The quantum dot complex of claim 1, wherein the quantum dot complex has a light maintaining percentage in a range of 90% to 105%, and the light maintaining percentage is expressed based on Equation 1:

$$\text{light maintaining percentage (\%)} = X_1/X_0 * 100 \qquad \text{[Equation 1]}$$

wherein in Equation 1, $X_1$ is a quantum yield measured after irradiating the quantum dot complex with 460 nm excitation light at an intensity of 60 $mW/cm^2$ for 500 hours, and $X_0$ is a quantum yield measured before irradiating the quantum dot complex with the excitation light.

15. A display device comprising:

a display panel; and a light control layer disposed on the display panel, the light control layer including a plurality of light control areas, wherein at least one of the plurality of light control areas includes a quantum dot complex, the quantum dot complex includes:

a quantum dot; and a plurality of ligands binding to a surface of the quantum dot, the plurality of ligands include:

a first ligand including a first acid functional group;

a second ligand including a second acid functional group different from the first acid functional group; and a third ligand including a thiol group, a sum of the first ligand and the second ligand contained in the plurality of ligands is in a range of 40% by weight to 45% by weight, based on a total weight of the plurality of ligands, and a content of the third ligand in the plurality of ligands is in a range of 15% by weight to 20% by weight, based on the total weight of the plurality of ligands.

16. The display device of claim 15, wherein the display panel includes a light-emitting element emitting a first light, and the light control layer includes:

a first light control area transmitting the first light therethrough;

a second light control area converting the first light into a second light; and a third light control area converting the first light into a third light.

17. The display device of claim 15, further comprising a color filter layer disposed on the light control layer, wherein the color filter layer includes a first filter, a second filter, and a third filter respectively corresponding to the first light control area, the second light control area, and the third light control area.

* * * * *